US011263522B2

(12) United States Patent
Nestler et al.

(10) Patent No.: US 11,263,522 B2
(45) Date of Patent: Mar. 1, 2022

(54) ANALOG SWITCHED-CAPACITOR NEURAL NETWORK

(71) Applicant: Analog Devices, Inc., Norwood, MA (US)

(72) Inventors: Eric G. Nestler, Long Beach Township, NJ (US); Naveen Verma, Princeton, NJ (US); Hossein Valavi, Princeton, NJ (US)

(73) Assignee: Analog Devices, Inc., Norwood, MA (US)

( * ) Notice: Subject to any disclaimer, the term of this patent is extended or adjusted under 35 U.S.C. 154(b) by 770 days.

(21) Appl. No.: 16/125,621

(22) Filed: Sep. 7, 2018

(65) Prior Publication Data

US 2019/0080231 A1    Mar. 14, 2019

Related U.S. Application Data

(60) Provisional application No. 62/555,959, filed on Sep. 8, 2017.

(51) Int. Cl.
*G06N 3/063* (2006.01)
*G06N 3/06* (2006.01)
*G06N 3/04* (2006.01)
*G11C 11/54* (2006.01)

(52) U.S. Cl.
CPC ......... *G06N 3/0635* (2013.01); *G06N 3/0454* (2013.01); *G06N 3/0481* (2013.01); *G06N 3/061* (2013.01); *G11C 11/54* (2013.01)

(58) Field of Classification Search
CPC ... G06F 15/7821; G11C 11/54; G06N 3/0635; G06N 3/061
See application file for complete search history.

(56) References Cited

U.S. PATENT DOCUMENTS 5,298,796 A * 3/1994 Tawel ............... G06N 3/0635
                                                  706/33
2005/0240787 A1  10/2005 Palem et al.
2015/0131383 A1   5/2015 Akerib et al.
(Continued)

OTHER PUBLICATIONS

Zhang, Jintao, Zhuo Wang, and Naveen Verma. "In-memory computation of a machine-learning classifier in a standard 6T SRAM array." IEEE Journal of Solid-State Circuits 52.4 (2017): 915-924. (Year: 2017).*

(Continued)

*Primary Examiner* — Benjamin P Geib
(74) *Attorney, Agent, or Firm* — Patent Capital Group

(57) ABSTRACT

Systems and methods are provided for reducing power in in-memory computing, matrix-vector computations, and neural networks. An apparatus for in-memory computing using charge-domain circuit operation includes transistors configured as memory bit cells, transistors configured to perform in-memory computing using the memory bit cells, capacitors configured to store a result of in-memory computing from the memory bit cells, and switches, wherein, based on a setting of each of the switches, the charges on at least a portion of the plurality of capacitors are shorted together. Shorting together the plurality of capacitors yields a computation result.

20 Claims, 17 Drawing Sheets

(56) References Cited

U.S. PATENT DOCUMENTS

2016/0064009 A1    3/2016  Every et al.
2016/0232951 A1*   8/2016  Shanbhag ............... G11C 7/16

OTHER PUBLICATIONS

Buhler, Fred N., et al. "A 3.43 TOPS/W 48.9 pJ/pixel 50.1 nJ/classification 512 analog neuron sparse coding neural network with on-chip learning and classification in 40nm CMOS." 2017 Symposium on VLSI Circuits. IEEE, 2017. (Year: 2017).*

Seshadri, Vivek, et al. "Buddy-ram: Improving the performance and efficiency of bulk bitwise operations using DRAM." arXiv preprint arXiv:1611.09988 (2016). (Year: 2016).*

Kang, Mingu, and Naresh R. Shanbhag. "In-memory computing architectures for sparse distributed memory." IEEE transactions on biomedical circuits and systems 10.4 (2016): 855-863. (Year: 2016).*

Valavi et al., *A Mixed-Signal Binarized Convolutional-Neural-Network Accelerator Integrating Dense Weight Storage and Multiplication for Reduced Data Movement*, 2018 IEEE Symposium on VLSI Circuits, IEEE, Jun. 18, 2018 pp. 141-142.

Win-San et al., *A 65mn 4Kb Algorithm-Dependent Computing-in-Memory SRAM Unit-Macro with 2.3ns and 55.8TOPS/W Fully Parallel Product-Sum Operation for Binary DNN Edge Processors*, 2018 IEEE International Solid State Circuits Conference (ISSCC), IEEE, Feb. 11, 2018, pp. 496-498.

International Search Report and Written Opinion issued in PCT/US2018/050169 dated Jan. 14, 2019, 15 pages.

Kang et al., *An Energy-Efficient VLSI Architecture for Pattern Recognition via Deep Embedding of Computation in SRAM*, 2014 IEEE International Conference on Acoustics, Speech and Signal Processing (ICSSP), May 4-9, 2014, pp. 8381-8385.

\* cited by examiner

ANALOG SWITCHED-CAPACITOR NEURAL NETWORK

CROSS REFERENCE TO RELATED APPLICATION

This Application claims priority to U.S. Patent Application Ser. No. 62/555,959 filed Sep. 8, 2017, which Application is considered incorporated by reference into the disclosure of this Application.

GOVERNMENT SUPPORT

This invention was made with government support under Grant No. FA9550-14-1-0293 awarded by the Air Force Office of Scientific Research. The government has certain rights in the invention.

TECHNICAL FIELD OF THE DISCLOSURE

The present invention relates to the field of neural-network implementations and matrix-vector multiplication.

BACKGROUND

Convolutional Neural Networks (CNNs) are an approach to Deep Neural Networks (DNNs), where a neuron's output, or activation, is derived from a set of activations from a previous CNN layer. In a CNN, the neuron is shifted over the activations from the previous CNN layer to yield an output activation for each shift. In some applications, a CNN layer operates over data arranged in a way that corresponds to the pixels of an input image. In this case, the output activations for a particular pixel are derived from the subset of input activations proximally-located around the corresponding pixel location. In general, many different neurons operate in parallel within each CNN layer, giving many output activations for every subset of input activations. Thus, each input pixel corresponds to activations from a potentially large number of neurons from the previous CNN layer, and so the input and output image at each stage can be described as having height, width, and depth dimensions.

With a trend towards increasing depth (i.e., number of activations for each pixel), neurons face a large amount of proximally-located input data to process and generate a large amount of proximally-located output data. Further, each neuron must be shifted over all of the input activations, thereby resulting in such proximally-located input and output activations for each pixel, but where pixels are distributed across the entire image. In practical implementations, this results in an immense amount of data movement, either for moving weights corresponding to the many different neurons to the subset of proximally-located input activations, or for moving all of the activations as proximally-located subsets to the weights of the many different neurons. Hardware architectures for CNN computation have focused on optimizing this data movement. One approach to CNNs that aims to reduce the data that must be moved is referred to as Binarized Neural Networks (BNNs), where weights and activations are each reduced to a single bit.

Overview

Systems and methods for reducing power in matrix-vector computations and in neural networks are disclosed. Additionally, systems and methods for charge domain in-memory computing are disclosed. According to some implementations, an apparatus for in-memory computing using charge-domain circuit operation includes a first plurality of transistors configured as memory bit cells, a second plurality of transistors configured to perform in-memory computing using the memory bit cells, a plurality of capacitors configured to store a result of in-memory computing from the memory bit cells, and a plurality of switches. Based on a setting of each of the plurality of switches, the charges on at least a portion of the plurality of capacitors are shorted together. Shorting together the plurality of capacitors yields a computation result.

According to various implementations, the first plurality of transistors is configured to store a plurality of matrix values. In some examples, the second plurality of transistors is configured to receive an input signal, perform analog charge-domain computations using the input signal and the plurality of matrix values, and generate the result of in-memory computing.

In some implementations, the plurality of capacitors are positioned above the first plurality of transistors and the second plurality of transistors. In some implementations, the plurality of capacitors are formed from metal fingers. In some examples, the capacitors are formed from metal plates and wires, or fingers, implemented in the metal layers available in a VLSI technology. In some examples, the capacitors are formed by the dielectric between metal interconnect layers.

In some implementations, the apparatus is configured to be placed in a neural network. In some examples, the apparatus is comprised by a neural network.

In some implementations, the first plurality of transistors are configured as single memory bit cells. In other implementations, the first plurality of transistors are configured as multiple memory bit cells.

According to some implementations, a circuit for matrix-vector computations includes multiple bit cell portions, multiple capacitors, and multiple switches. The bit cell portions configured to store matrix elements, receive broadcast vector elements, perform compute operations, and generate bit cell outputs. The capacitors are configured to store the bit cell outputs from the plurality of bit cell portions. In a first switch configuration, charge from at least a portion of the capacitors are shorted together.

In some implementations, the circuit is configured to perform matrix-vector multiplication operations. In some implementations, the compute operations are XNOR compute operations, XOR compute operations, NOR compute operations, AND compute operations, OR compute operations, NAND computer operations, or NOT compute operations. In some implementations, the compute operations are logic operations. The compute operations can include any logic operations.

In some implementations, the capacitors are formed from metal fingers. In some implementations, the capacitors are positioned above the bit cell portions. In some examples, the bit cell portions each include multiple transistors.

In some implementations, the circuit is configured to be placed in a neural network. In some implementations, the circuit is comprised of a neural network. In various implementations, the bit cell portions are configured as one of single memory bit cells and multiple memory bit cells.

According to some implementations, a method for matrix-vector computation includes storing matrix elements locally in a compact circuit structure, broadcasting vector elements to the matrix elements, storing charge on a plurality of capacitors to locally perform a computation, and accumulating charge from each of the plurality of capacitors by shorting together charge from the plurality of capacitors. In some examples, the matrix elements are 1-bit matrix elements. In some examples, the vector elements are 1-bit vector elements.

In some implementations, the method includes performing analog charge domain computations using the matrix elements and the vector elements.

In some implementations, the compact circuit structure includes multiple transistors, and the method further includes receiving an input signal at the transistors.

In some implementations, the method includes discharging the capacitors, wherein discharging results in the charge on each of the capacitors having a logic value of zero, and the method includes conditionally charging each of the capacitors, based on a respective matrix element and a respective vector element. In some implementations, discharging the capacitors further includes closing multiple switches and activating a discharge transistor, wherein each of the switches is coupled to a corresponding capacitor.

In some implementations, accumulating charge from each of the capacitors results in generating an analog pre-activation value.

In some implementations, the method includes closing multiple switches to cause the charge from each of the capacitors to short together, wherein each of the switches is connected to a respective capacitor.

BRIEF DESCRIPTION OF THE DRAWING

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Neural networks are used in numerous applications, including inference applications, image classification, image detection, speech recognition, and language translation. There are a variety of different kinds of neural networks, including, for example, convolutional neural networks (CNNs), recurrent neural networks (RNNs), and multi-layer perceptrons (MLPs). The core computation in neural networks is a form of matrix-vector multiplication (MVM).

Systems and methods for significantly reducing power in neural networks and in matrix-vector multiplication are disclosed. In various implementations, the systems and methods significantly reduce power in Deep Neural Networks and Convolution Neural Networks. In particular, systems and methods are disclosed for integrating hardware for activation and weight storage in a small-sized circuit block using sampled analog technology. An architecture for binarized Neural Networks is disclosed. In various implementations, the systems and methods apply to multi-bit neural network activations and weights. Neural networks using the systems and methods described herein use 10-100× less power than conventional neural-network processors.

Sampled analog signal processing is performed in the analog domain by charge sharing among capacitors using only electronic switches and capacitor elements. A sampled analog filter filters incoming analog signals without first digitizing the signals. Sampled analog circuits use discrete time filter architectures combined with analog signal processing, which eliminates any data path quantization noise issues and analog-to-digital and digital-to-analog conversion steps.

Large-scale matrix-vector multiplications are limited by data movement in modern very large-scale integration (VLSI) technologies. Additionally, large-scale matrix-vector multiplications are computationally intensive, consuming significant amounts of power. Large-scale matrix-vector multiplications are used in deep neural networks (DNNs), and dominate the power usage of the DNNs. Systems and methods are provided for reducing data movement in large-scale matrix-vector multiplications, and decreasing the power usage. In particular, in one implementation, an in-memory-computing accelerator is provided that employs a charged-domain mixed-signal operation for enhancing compute SNR and scalability. In one implementation, MVM is used in a binarized CNN accelerator.

Figure 1:
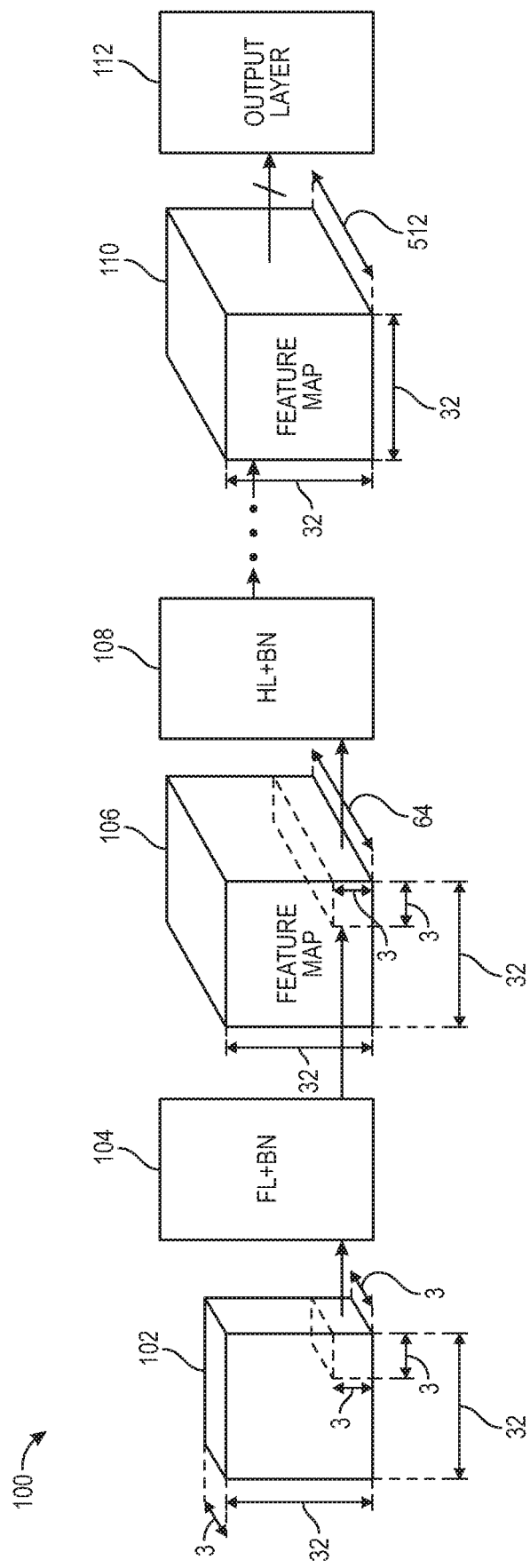
FIG. 1 is a diagram illustrating the structure of a CNN, showing a cascading of first layer (FL) with batch-normalization (BN) layers and hidden layers (HLs), according to some embodiments of the disclosure.

FIG. 1 is a diagram illustrating the structure of a CNN 100, according to some embodiments of the disclosure. The CNN 100 shown is a deep binarized CNN, including an imager 102, a first layer (FL) 104, a first feature map 106, one or more hidden layers (HLs) 108, a second feature map 110, and an output layer 112. The embodiment described is configurable to implement either first layers or hidden layers.

The first layer 104 receives input activations from the imager 102. The first layer 104 multiplies the input activations with filter weights. The input activations may be an analog signal, and may have a high dynamic range. The first layer 104 can take analog input activations directly from an imager or other analog sensor. Thus, the first layer 104 can directly interface with an imager or other analog sensor, without the need for an ADC. According to various implementations, the first layer 104 samples the analog signals corresponding to the analog input activations. In some implementations, the first layer 104 multiplies the analog input activations with binary filter weights. In other implementations, the input activations are binarized layers. Following the first layer 104 may be a batch-normalization layer.

The one or more hidden layers 108 receive an input feature map. The input feature map may contain analog values. In one implementation, multiple hidden layers 108 are implemented within one chip. In other implementations, multiple hidden layers 108 are implemented on cascaded chips. In one example, chips are cascaded into a high-throughput pipeline, and input activations are provided row-by-row.

Figure 2:
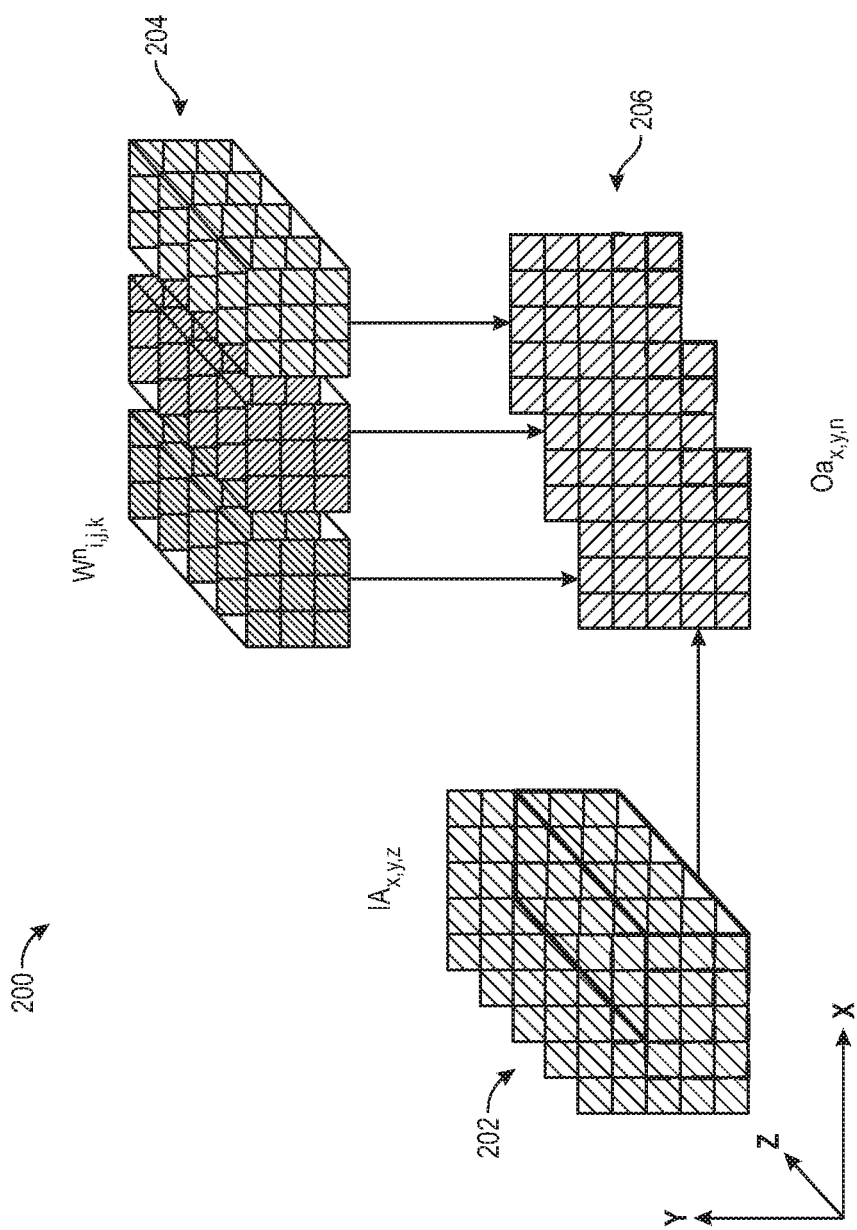
FIG. 2 is a diagram illustrating computational operations of a CNN, showing input activations being multiplied with neuron-filter weights and accumulated to generate output activations, according to some embodiments of the disclosure.

FIG. 2 is a diagram 200 illustrating computational operations of a CNN, including input activations 202, weights 204, and output activations 206, according to some embodiments of the disclosure. The computational operations shown in the diagram 200 are matrix-vector multiplication (MVM). In particular, the input activations 202 are multiplied with the weights 204 to generate the output activations 206 matrix. The input activation 202 pixels are arranged in a 3D array. The weights 204 are arranged in multiple 3D arrays. In some examples, the weights 204 are arranged in filters, and include one 3D array of weights for each filter. The weights 204 are learned from training the neural network. The primary operation of a CNN is convolution between input activation 202 pixels and weights 204 to generate output activations 206.

In one example, the input activations are represented as $IA_{x,y,z}$ and the N 3-dimensional weight filters are $W^n_{i,j,k}$, where in =1:N. The convolution is an inner product operation, which yields a pre-activation result for each filter:

$$PA_{x,y,n} = \Sigma_{i,j,k} IA_{x+i,y+j,z+k} W^n_{i,j,k} \qquad (1)$$

Following the inner product operation is a nonlinear activation function that yields an output activation for each filter:

$$OA_{x,y,n} = \rho(PA_{x,y,n}) \qquad (2)$$

The filters are then shifted with a stride of one over the input activations, generating a 3D array of output activations. The 3D array of output activations constitutes a feature map. There can be any number of filters in each hidden layer. In various examples, each hidden layer includes 8 filters, 16 filters, 32 filters, 64 filters, 128 filters, 256 filters, 512 filters, 1024 filters, or more than 1024 filters. The filters capture a diversity of information in the feature map.

Matrix-vector multiplication in traditional VLSI processors is power-intensive, and the movement of data dominates the energy consumption. The data movement includes the movement of input activations, the movement of weights, and the movement of output activations. According to various implementations, using the systems and methods discussed herein, data movement in MVM is decreased, resulting in a ten to one hundred fold decrease in energy consumption.

In many applications, the large data structures (vectors and matrices) used for MVM are stored on a chip in embedded memory (e.g., in RAM, SRAM, DRAM, MRAM, RRAM). The data structures are stored on the chip in embedded memory because the data structures are re-used multiple times. For example, in MVM, the vector is re-used when it is multiplied across each of the rows of the matrix. Similarly, the weights of the weight matrix are reused when multiplied with each of the input activation matrices. Energy is used to access data from embedded memory. The energy is the data movement cost. The energy used to access the data from embedded memory can be orders of magnitude higher than the energy to perform the computation on the data once it is accessed.

In-memory computing helps mitigate the costs of data movement. In a standard SRAMS, the data is accessed from memory row-by-row. Thus, for a matrix with 128 rows, it takes 128 cycles to access all the data out of the memory. Accessing the data incurs a communication cost, which consumes energy, and that communication cost is incurred 128 times.

In-Memory Computing

In in-memory computing, instead of accessing raw data row-by-row in each column, a computational result over the data in each column is accessed, over the rows of the column. For a matrix with 128 rows, a compute result is done over the 128 bits in a column. Thus, instead if accessing the raw data 128 times, it is accessed one time for each column, thereby amortizing the bit-line discharge energy and delay.

However, in-memory computing can decrease the computational signal-to-noise ratio (SNR). This is because when the computation is done over all the bits in the column, the dynamic range increases. In particular, computation over multiple inputs increases the dynamic range, which must fit within the constrained bit-line swing, thereby degrading the computational SNR. Traditionally, these computations are current-domain computations and rely on bit-cell MOSFET transfer functions. The output current from a bit-cell comes from transistors inside the bit-cell, which are susceptible to current non-linearities, variations, and noise. Voltage domain computations similarly rely on transistors inside bit-cells, and are similarly susceptible to non-linearities, variations, and noise.

Systems and methods are provided herein for in-memory computing with a high computational SNR. The systems and methods, discussed below, include charge-domain computation using capacitors. In some examples, the capacitors are metal-oxide-metal (MOM) finger capacitors. Charge domain computation using capacitors is significantly more robust (e.g., to variations, non-linearities, noise) than current-domain or voltage-domain computation, which rely on transistors, thus leading to higher SNR. Additionally, charge domain computation using capacitors is more energy efficient.

Hidden Layer

Figure 3:
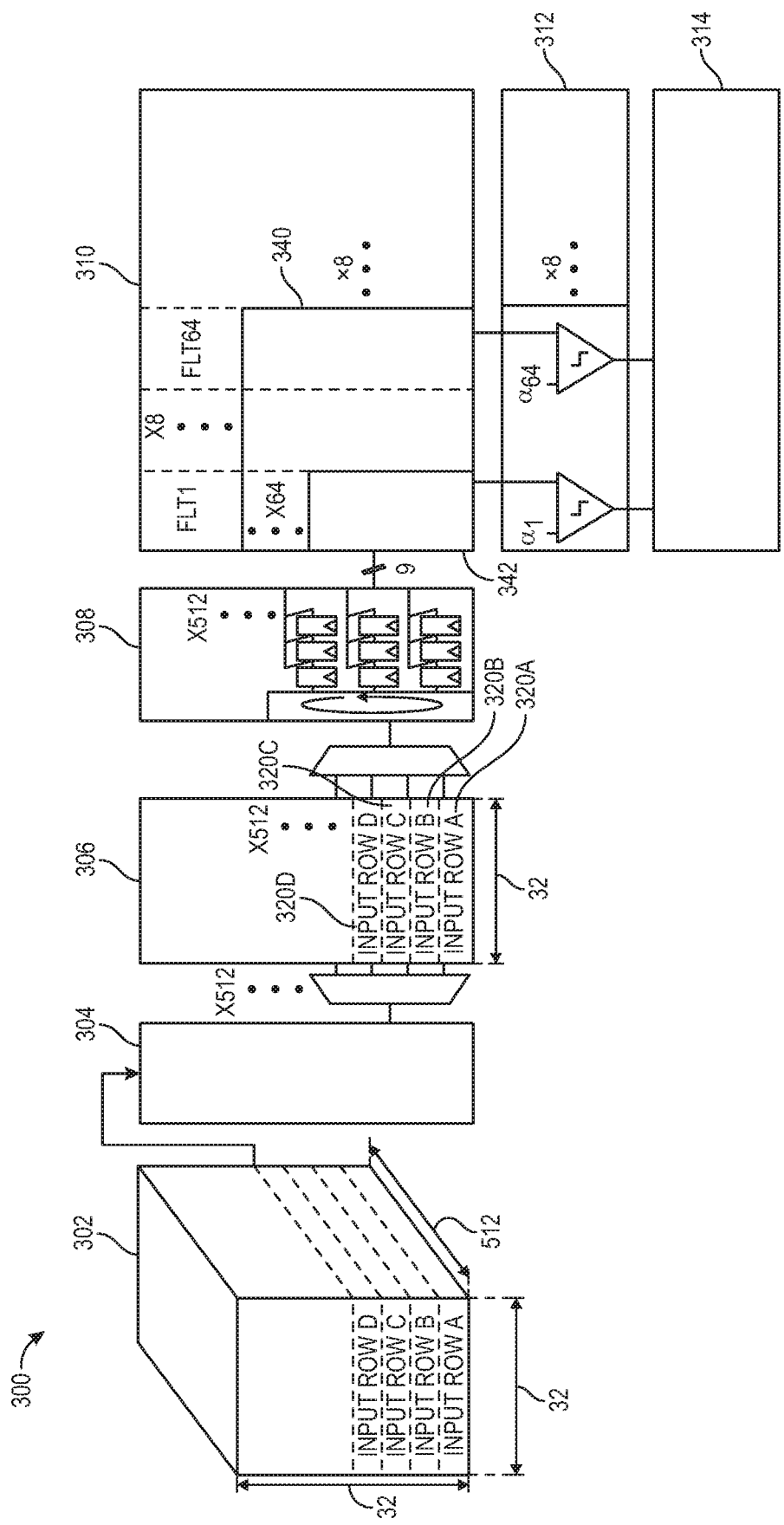
FIG. 3 is a diagram illustrating one layer of a CNN, showing buffering circuits for enabling computations in a pipeline for the different layers, according to some embodiments of the disclosure.

FIG. 3 is a block diagram illustrating one layer 300 of a CNN, according to some embodiments of the disclosure. The layer 300 of a CNN is a hidden layer configuration, and includes an input feature map 302, an input shift register 304, an input activation SRAM 306, an input activation buffer 308, a neuron array 310, a bin batch normalization block 312, and an output shift register 314. The following discussion of the layer 300 of a CNN uses an input feature map 302 having an x×y dimension of 32×32, and a depth d of 512. However, in other implementations, the input feature map 302 can have any dimensions.

The data flow in the layer of the CNN begins at the input feature map 302. According to one implementation, each input has an input feature map. In one example, as shown in FIG. 3, the xy dimension of the input feature map 302 is 32×32, and the depth d of the input feature map 302 is 512. The CNN applies a kernel to a patch of pixels, where the patch has an x×y dimension and a depth d. The patch is a subset of the input feature map 302 in the xq dimension. In one example, a patch is 3×3 in the x×y dimension and 512 in the depth d dimension. That is, the x×y dimension of the patch is a subset of the input feature map 302, while the depth d of the patch is the same as the depth of the input feature map 302. The patch is treated as a column vector (e.g., a 9×512 vector). The column vector representing the patch is multiplied by the weights (kernels) in a weight matrix. For example, the column vector is multiplied by the first row of the weight matrix, the second row of the weight matrix, and this is repeated through to the last row of the weight matrix. The product of the multiplication of each row of the weight matrix is the corresponding output from that feature map, and is stored in the input shift register 304. This operation is an efficient reshaping of the input feature map 302 to allow the chip to be used in a pipeline in order to implement a DNN.

The data from the input shift register 304 is loaded in parallel into the input activation SRAM 306. The input activation SRAM 306 serves as a line buffer, and is used to buffer data. In one example, the input activation SRAM 306 includes four rows 320a-320d, each having d columns. In some implementations, the input activation SRAM 306 is used to accommodate streaming inputs. The CNN layers form a pipeline where an output row of activations is generated for every input row accessed. Three input rows are buffered before the layer begins its processing, in the input activation SRAM 306. For example, in one implementation, input data is 32×32 pixels, and the activation SRAM has a size of 32×4×d. That is, an extra row is accommodated (four rows, instead of three rows) to permit processing simultaneously with buffering of incoming data, for pipelined operation. According to one example, the input feature map 302 is provided one pixel at a time, and d=512. Thus, 512 bits are loaded into the shift register 304, and the 512 bits are loaded into one of the rows 320a-320d of the input activation SRAM 306. In one implementation, while an incoming row of the feature map 302 is loaded into one of the rows 320a-320d, pixels for the three other rows 320a-320d are processed for 3×3 filtering.

In one example, once three of the rows 320a-320d in the input activation SRAM 306 are loaded, the input activations to be processed (the input activations from the three loaded rows) are shifted from the input activation SRAM 306 to the input activation buffer 308. The input activation buffer 308 includes multiple 3-bit shift registers with a circular input interface to implement a length-1 striding for convolution. In one example, the input activation buffer 308 holds 3×3×d input activations and broadcasts the input activations over the neuron array 310 (discussed in more detail below).

The input activation buffer 308 implements a shift register, and the patch of 3×3×d is strided on to the next bit. In particular, if the first patch of 3×3×d is on the bottom left of the input feature map 302, then the next patch of 3×3×d is the patch that starts by moving to the right by one bit. Thus, many of the bits in the 3×3×d are reused in the next 3×3×d. The striding operation is implemented by the shift register in the input activation buffer 308. Then, the next three bits, which occur because the convolution operation is strided, are loaded. In one example, the next three bits are loaded into the shift register and shift along such that the previous 2×3×512 bits remain in the input activation buffer 308 and are not reloaded. This allows for efficient implementation of the striding operation.

Thus, the input activation buffer 308 has 3×3×512 bits loaded in it on which to perform a compute operation. The 3×3×512 bits become a 1D vector to multiply by a matrix of weights. In particular, the 3×3×512 bits are broadcast over the neuron array 310, which implements the analog matrix-vector multiplication.

The neuron array 310 implements rows of matrix multiplication. Rows are each called a neuron or a filter. In the description herein, the hardware for implementing the neuron array 310 is called a neuron tile. In one example, a neuron tile includes an 8×8 array of filters; there are 64 filters in a neuron tile. The neuron array 310 includes eight neuron tiles. The neuron tiles provide clock-gating scalability of both the filter size and the number of filters. Each neuron tile implements 3×3×64-input segments (vertically) of 64 different filters (horizontally). Clock-gating neuron tiles vertically scales the filter size. Clock-gating neuron tiles horizontally scales the number of filters. In this way, up to 512 preactivation inputs can be computed in parallel, corresponding to one pixel, with a depth up to 512.

Clock-gating neuron tiles allows matrix-vector multiplication to have variable dimensionality depending on the size of the compute, which allows for energy savings for smaller matrix-vector dimensions. In particular, clock-gating triggers the signals to go high and low so if the clock is stopped, the signals stop, saving energy. In the example above, the depth of the feature map is 512. In other examples, the depth of the feature map is 16, 32, 64, 128, 256, more than 256, or less than 16.

The computed pre-activations output from the neuron array 310 are input to a Binarizing Batch Normalization (Bin Batch Norm) block 312. In particular, the pre-activations are an analog output from the neuron array 310, and the input to the Bin Batch Norm 310 is in analog. The Bin Batch Norm block 310 activates a non-linear activation function for neural network computations. According to one example, the Bin Batch Norm block 312 processes as many neuron array 310 analog pre-activation outputs as there are rows in the pre-activation matrix. In the example above, there are 64 filters per neuron tile and eight neuron tiles, and thus there are 512 Bin Batch Norm circuits (64×8) to process the input. The Bin Batch Norm block 312 computes binary output activations for each pixel. The Bin Batch Norm block 312 receives an analog pre-activation input signal and outputs a digital output activation signal. Computed output activations are streamed out to an output shift register 314. In some examples, the output activations directly feed the next layer of the neural network in a pipelined manner.

Figure 4:
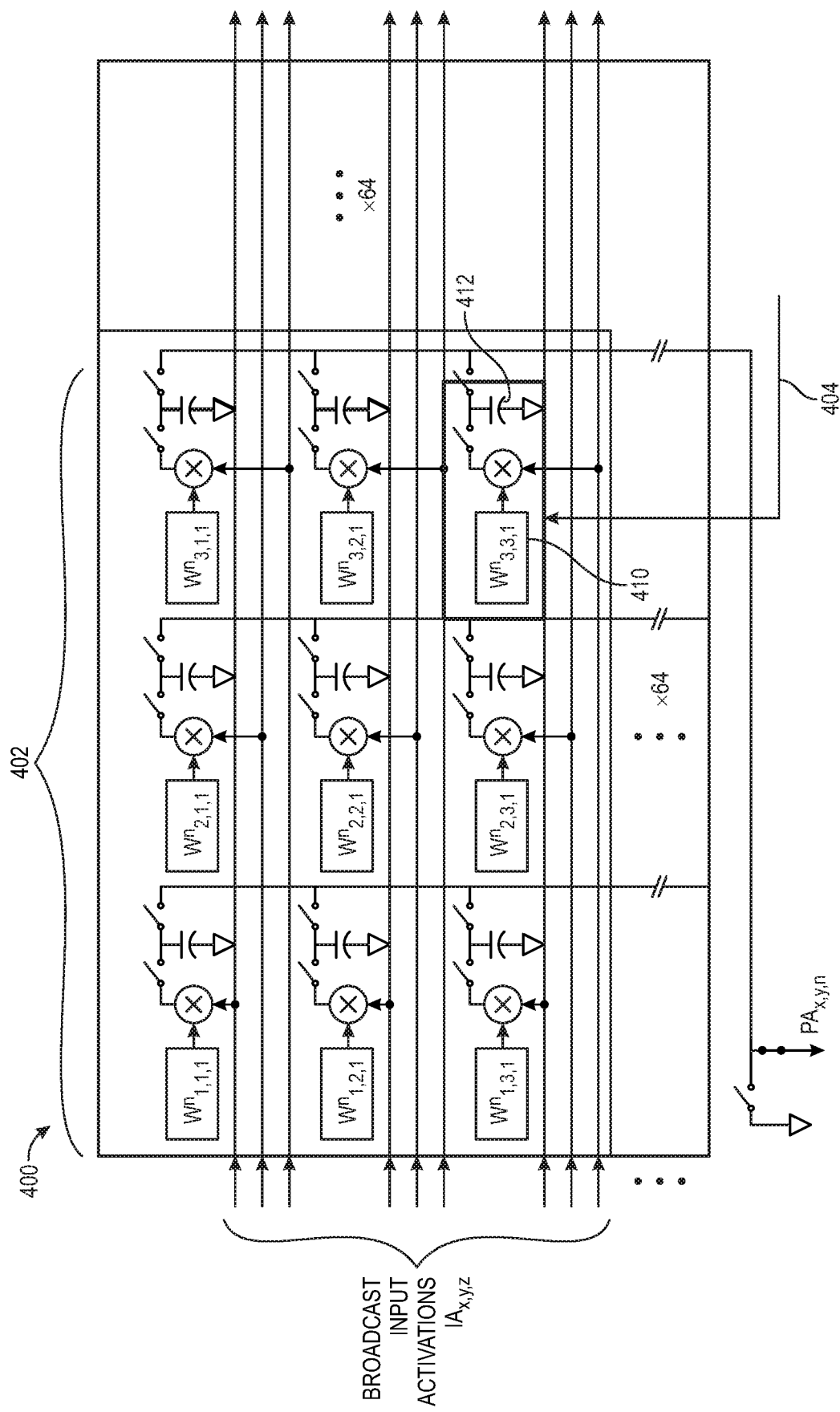
FIG. 4 is a diagram illustrating a neuron tile, where multiplication and accumulation of input activations and weights occurs, according to some embodiments of the disclosure.

FIG. 4 is a diagram illustrating a neuron tile 400, according to some embodiments of the disclosure. Neuron tiles, such as neuron tile 400, make up the neuron array 310, which computes the matrix-vector multiplications. In one example, each neuron tile 400 includes 64×64 neuron patches 402. Each neuron patch 402 is 3 elements wide×3 elements high×64 elements deep. Each of the elements in the neuron patch 402 is a multiplying bit cell 404, described in greater detail with respect to FIG. 5. In some examples, the depth of each patch 402 can be equal to or less than 64, and when there are eight neuron tiles 400, the total depth is up to 512 in the vertical dimension. Additionally, the neuron tile 400 has 64 discrete filters (or neurons), and thus can have 64 different 3×3×64 patches 404 in the horizontal direction. Note that in other examples, a neuron tile 400 can be any size.

Each neuron patch 402 processes 3×3 binary input activations. The 64 neuron patches 402 in one column form a single logical neuron filter, while the 64 different columns correspond to different neuron filters. Within a neuron patch 402, each input activation is processed by an element called a multiplying bit cell 404. Multiplying bit cells, such as multiplying bit cell 404, store 1-bit data (+1 or −1) representing the filter weight 410, and compute the multiplication with the input activation elements that are broadcast over the neuron tiles 400. The multiplying bit cell 404 multiplies the corresponding input activation with a stored filter weight 410, and stores the result as charge on a local capacitor 412. Then, all capacitors in one neuron filter are shorted together to perform charge accumulation, yielding the pre-activation output via a multiplication accumulation inner-product operation. Thus, the multiplying bit cell circuit 404 does charge domain compute using switched capacitors, such as the capacitor 412. Using this structure, weights 410 are stored where the multiplication is computed, so there are no weight movements.

Figure 5:
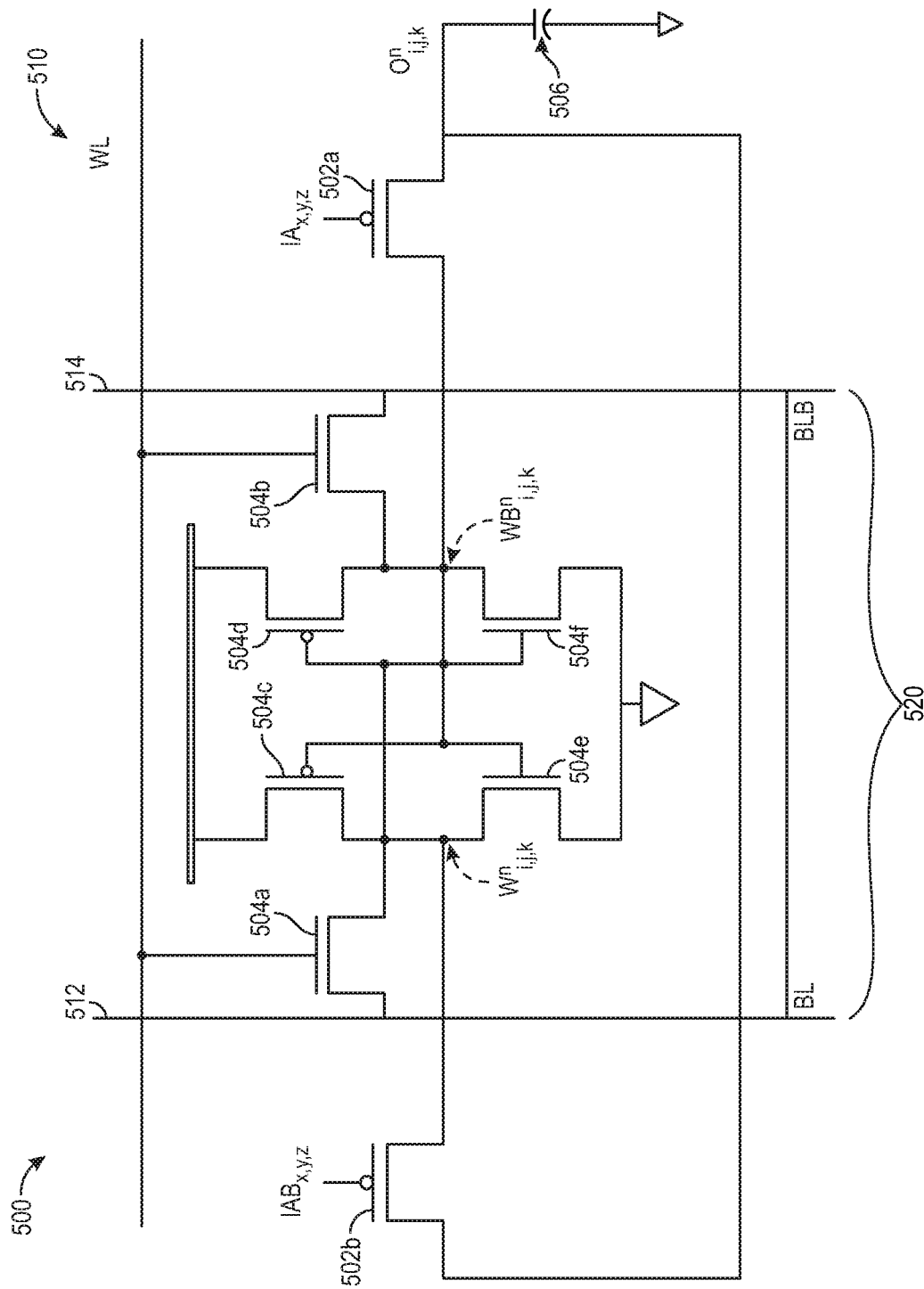
FIG. 5 shows a circuit architecture of a multiplying bit cell, a highly dense structure for achieving weight storage and multiplication, according to some embodiments of the disclosure.

FIG. 5 shows a circuit architecture of a multiplying bit cell 500, a highly dense structure for achieving weight storage and multiplication, thereby minimizing data-broadcast distance and control signals, according to some embodiments of the disclosure. The multiplying bit cell 500 includes a 6-transistor bit cell portion 520, first transistor 502a, second transistor 502b, a capacitor 506, a word line (WL) 510, a first bit line (BL) 512, and a second bit line (BLb) 514. The 6-transistor bit cell portion 520 is the middle portion of the bit cell 500, shown between the first 512 and second 514 bit lines, and includes 6 transistors 504a-504f. The multiplying bit cell 500 includes two additional transistors, first 502a and second 502b transistors, two transistors more than a standard SRAM bit cell. The 6-transistor bit cell portion 520 can be used for storage, and to read and write data. In one example, the 6-transistor bit cell portion 520 stores the filter weight. In some examples, data is written to the multiplying bit cell 500 through the word line (WL) 510, the first bit line (BL) 512, and the second bit line (BLb) 514. The first 502a and second 502b transistors are driven by the input activation signal. The multiplying bit cell 500, including the first 502a and second 502b transistors, can implement computation on the data stored in the 6-transistor bit cell portion 520.

In the multiplying bit cell 500, 1-bit multiplication corresponds to an XNOR operation. An XNOR operation can be performed with the input activation that has been broadcast over the multiplying bit cell 500. The XNOR logic is represented by the following truth table:

TABLE 1

| XNOR Logic | | |
|---|---|---|
| $IA_{x,y,z}$ | $W^n_{i,j,k}$ | $O^n_{i,j,k}$ |
| 0 | 0 | 1 |
| 0 | 1 | 0 |
| 1 | 0 | 0 |
| 1 | 1 | 1 |

The result of a computation is sampled as charge on a capacitor 506. According to various implementations, the capacitor 506 is positioned above the bit cell 500 and utilizes no additional area on the circuit. In some implementations, a logic value of either Vdd or ground is stored on the capacitor 506. Thus, the value that is stored on the capacitor 506 is highly stable, since the capacitor 506 value is either driven up to supply or down to ground. In some examples, the capacitor 506 is a MOM finger capacitor, and in some examples, the capacitor 506 is a 1.2 fF MOM capacitor. MOM capacitors have very good matching temperature and process characteristics, and thus have highly linear and stable compute operations. Note that other types of logic functions can be implemented using multiplying bit cells by changing the way the additional transistors 502a, 502b are connected.

In various implementations, the 6-transistor bit cell portion 520 is implemented using different numbers of transistors, and has different architectures. In some examples, the bit cell portion 520 can be a DRAM, MRAM, or an RRAM. In some examples, the bit cell portion 520 is 2,3-transistor DRAMs.

Figure 6:
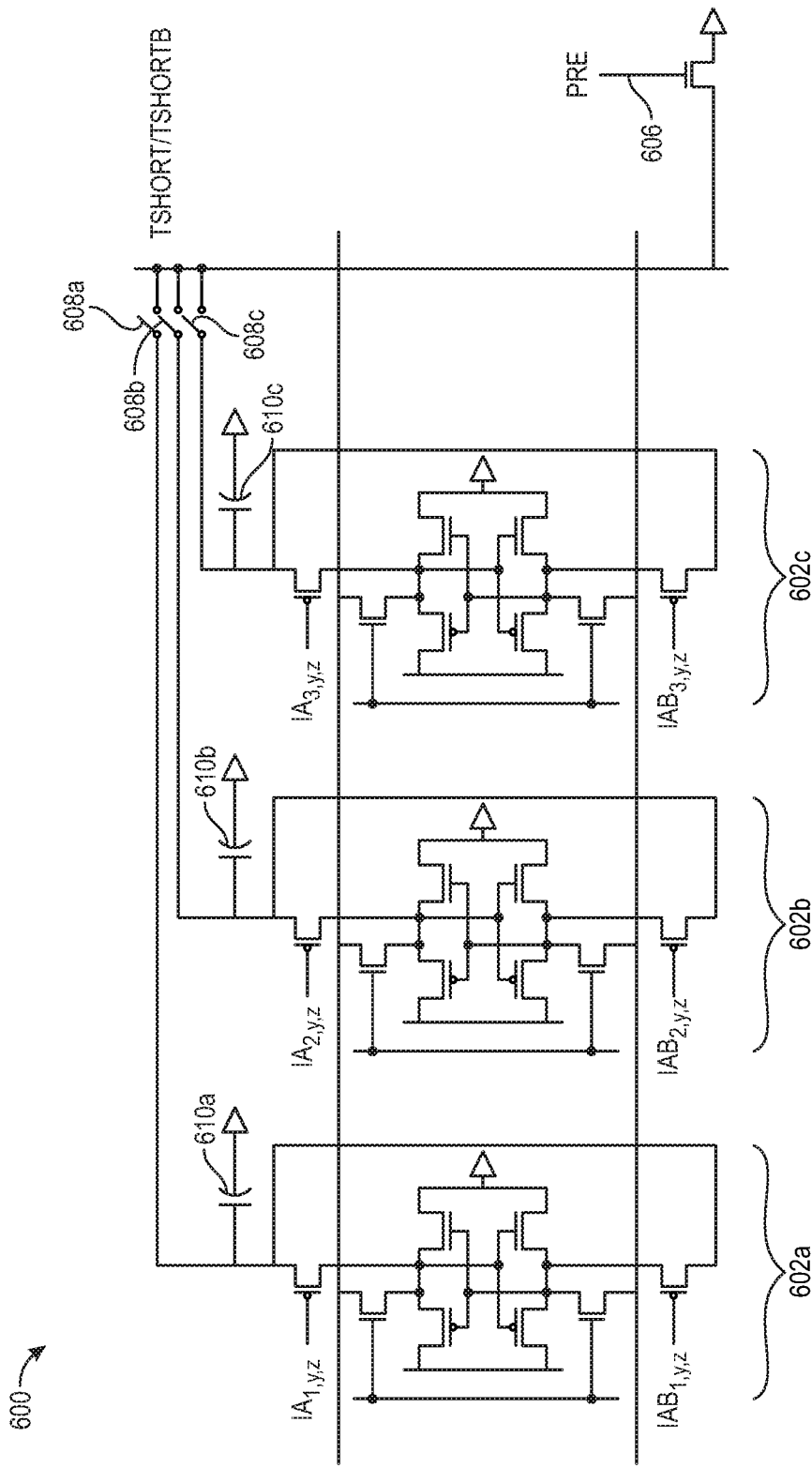
FIG. 6 is a diagram showing three multiplying bit cells, according to some embodiments of the disclosure.

FIG. 6 is a diagram showing a circuit 600 including first 602a, second 602b, and third 602c multiplying bit cells laid out together, according to some embodiments of the disclosure. The first 602a, second 602b, and third 602c multiplying bit cells are each connected to a respective shorting switch 608a, 608b, 608c, and a pre-discharge switch 606. According to one implementation, laying out three multiplying bit cells together enhances density of the output.

Figure 7A:
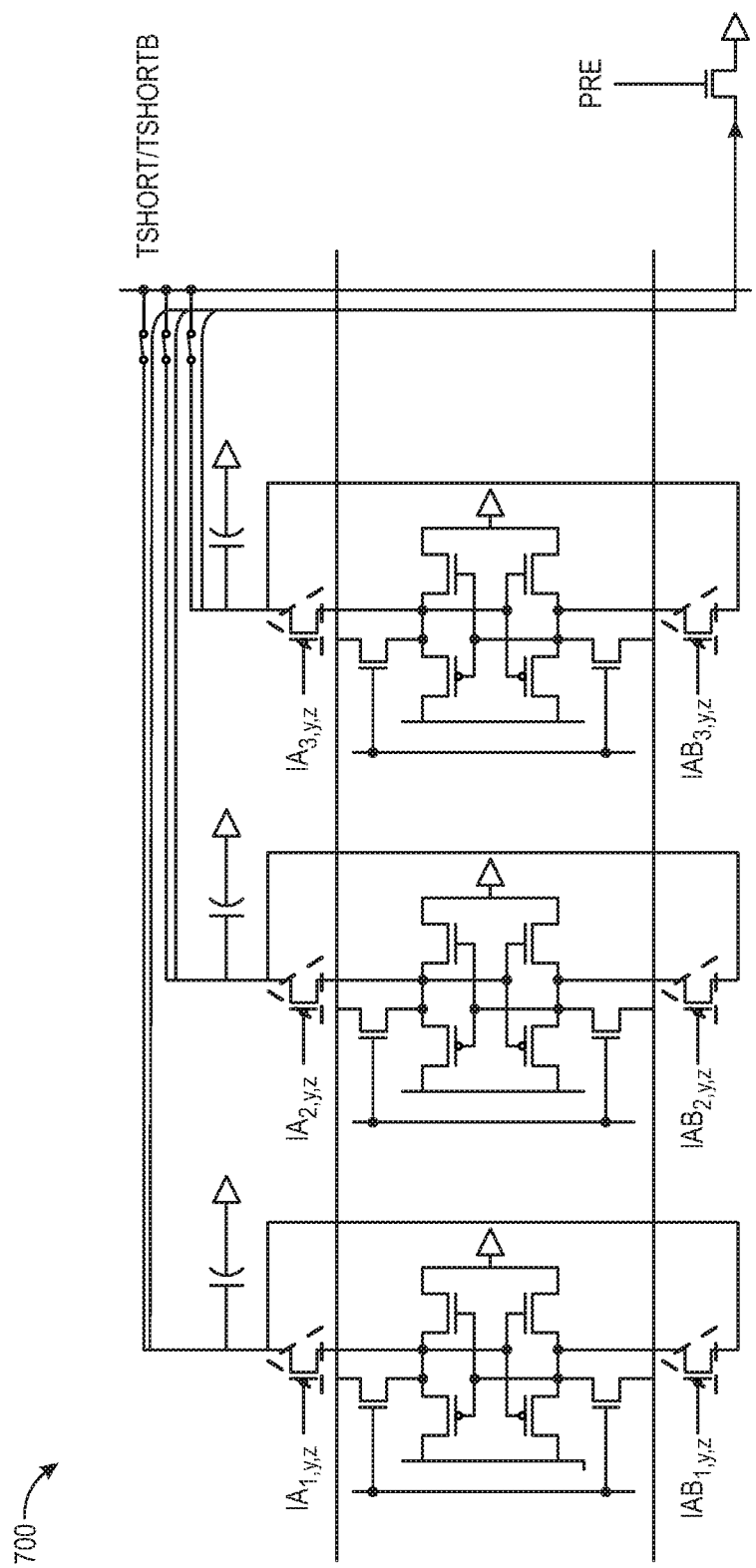
FIGS. 7A-7C show a computation using multiplying bit cells, according to some embodiments of the disclosure.
Figure 7B:
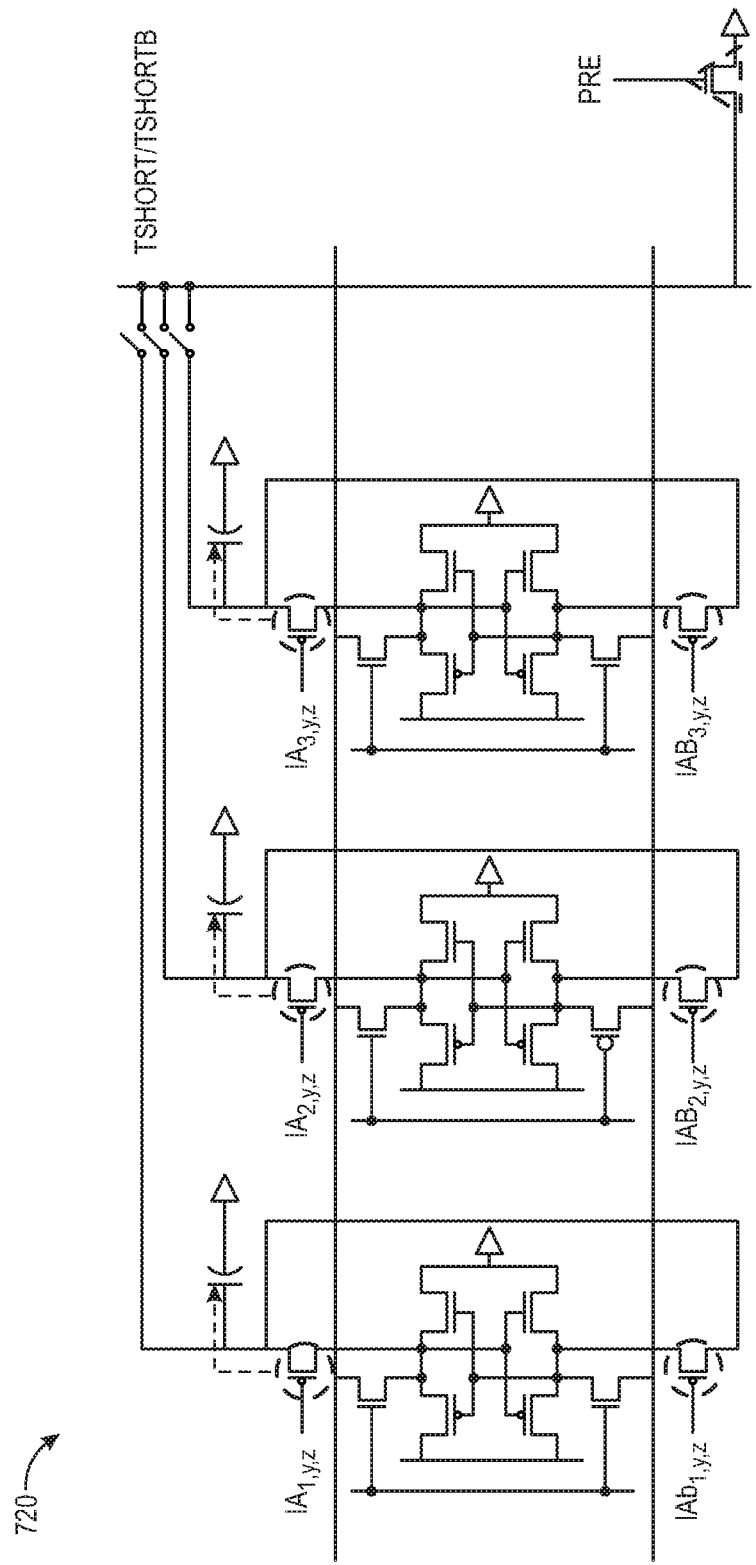
Figure 7C:
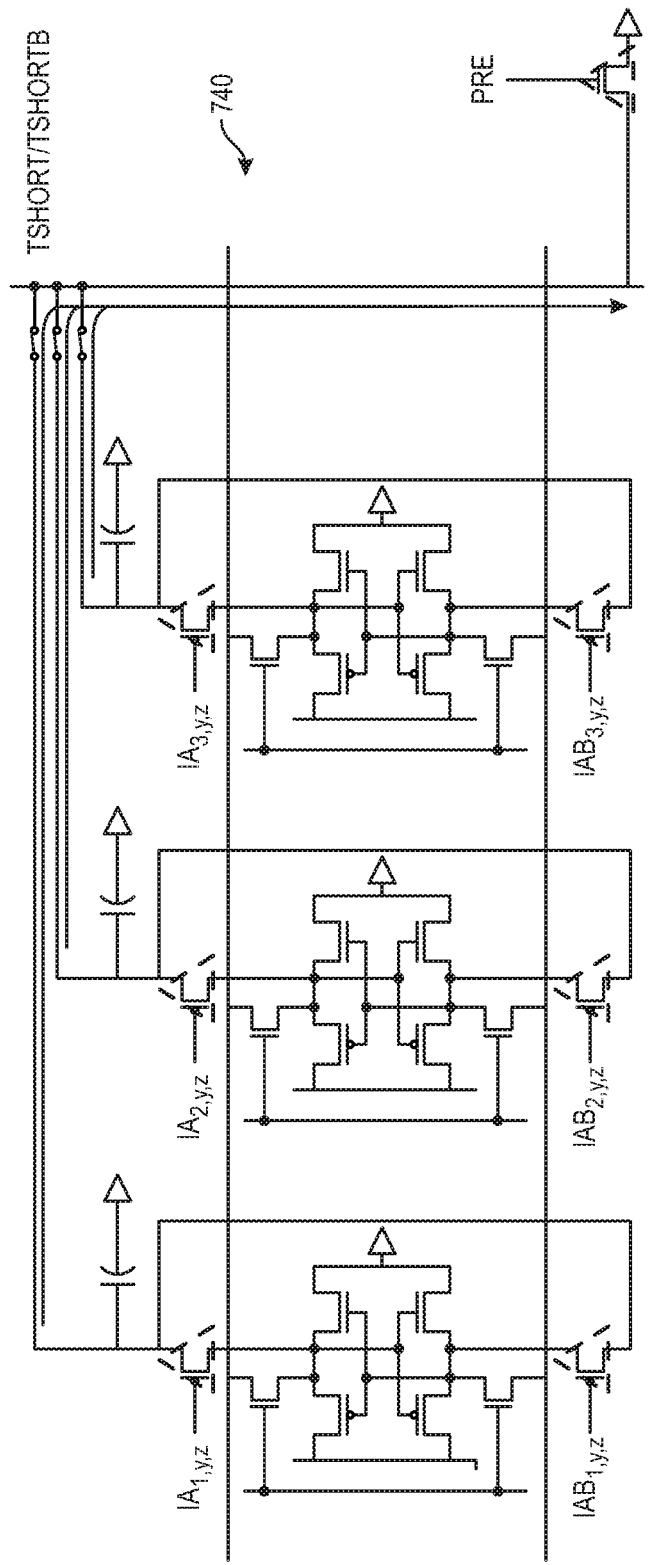

FIGS. 7A-7C show a computation using first 602a, second 602b, and third 602c multiplying bit cells, according to some embodiments of the disclosure. FIG. 7A shows a diagram 700 in which the shorting switches 608a, 608b, 608c are closed, and a discharge NMOS on the pre-activation node is activated. Closing the shorting switches 608a, 608b, 608c and activating the discharge NMOS results in an unconditional discharge of the capacitors 610a, 610b, 610c, such that the capacitors 610a, 610b, 610c start off at a logic value of zero. When the multiplication is performed at the multiplying bit cells 602a, 602b, 602c, since the capacitors 610a, 610b, 610c begin with a logic value of zero as shown in FIG. 7A, the capacitors 610a, 610b, 610c charge to one if the result of the computations indicates that capacitors 610a, 610b, 610c need to charge to one. If the result of the computation indicates that the capacitors 610a, 610b, 610c values need to charge to zero, no further operations are performed since the capacitors 610a, 610b, 610c start at a charge of zero. The input activation signals are held high at Vdd to deactivate the multiple bit cell PMOS devices, thereby decoupling the bit-cell storage nodes.

FIG. 7B shows a diagram 720 in which the input activations are driven differentially. In particular, one PMOS transistor in each multiple bit cell is activated, causing the capacitors 610a, 610b, 610c to charge up XNOR conditionally dependent on the input activation and stored weight. That is, the charge on the capacitors 610a, 610b, 610c either goes to one or stays at zero, depending on the result of the XNOR.

FIG. 7C shows a diagram 740 in which the capacitors 610a, 610b, 610c in one neuron filter are shorted together to generate an analog pre-activation value, according to various embodiments. In particular, the Tshort switches 608a, 608b, 608c are closed, but the PRE switch 606 is disabled. Shorting the Tshort switches 608a, 608b, 608c causes the charge from the capacitors 610a, 610b, 610c to be accumulated. Accumulating the results from each of the capacitors 610a, 610b, 610c is summing up the multiplication results from the matrix-vector multiplication to generate the analog pre-activation value.

According to other implementations, there are various other multiplying bit cell architectures for minimizing the length over which the activations are broadcast. In some implementations, the XNOR have different logical structures, using the complementary nature of PMOS and NMOS devices. In some examples, this allows a smaller integration of the combined functions of multiplication and memory than the embodiment shown in FIGS. 5, 6, and 7A-7C. Similarly, other aspects of the circuit architecture shown in FIGS. 5, 6, and 7A-7C can be varied.

Figure 8:
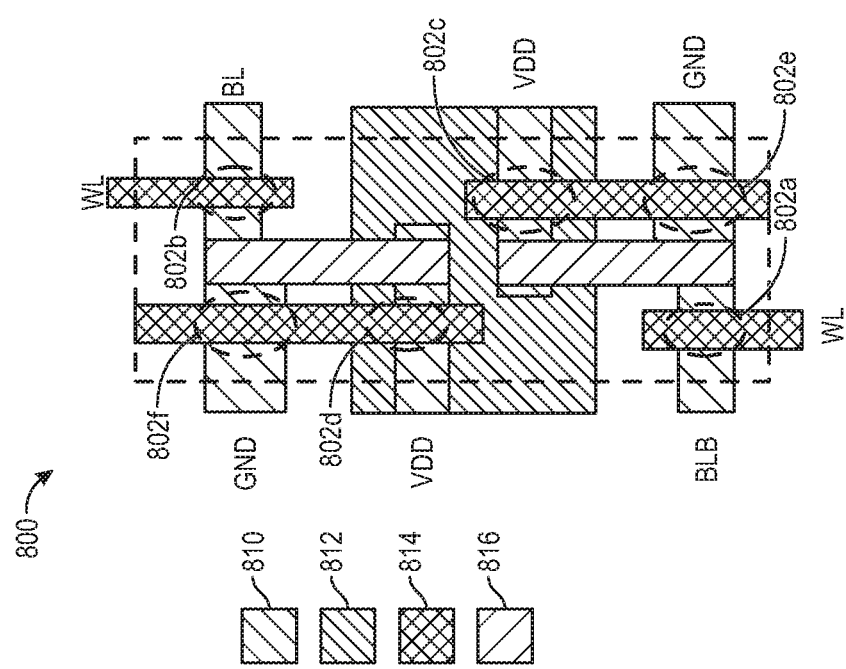
FIG. 8 shows the layout of a six-transistor SRAM bit cell, according to some embodiments of the disclosure.

FIG. 8 shows the layout of a six transistor SRAM bit cell 800, according to some embodiments of the disclosure. The bit cell 800 includes an active transistor diffusion layer 810, an n-well layer 812, a gate-poly layer 814, and a metal layer 816. In some examples, the gate-poly layer 814 is made of polysilicon, and the metal layer 816 is copper. The bit cell 800 includes six transistors 802a, 802b, 802c, 802d, 802e, and 802f. Referring back to FIG. 5, transistor 802a corresponds to the transistor 504a, transistor 802b corresponds to transistor 504b, transistor 802c corresponds to the transistor 504c, transistor 804d corresponds to the transistor 504d, transistor 802e corresponds to the transistor 504e, and transistor 802f corresponds to the transistor 504f.

Figure 9:
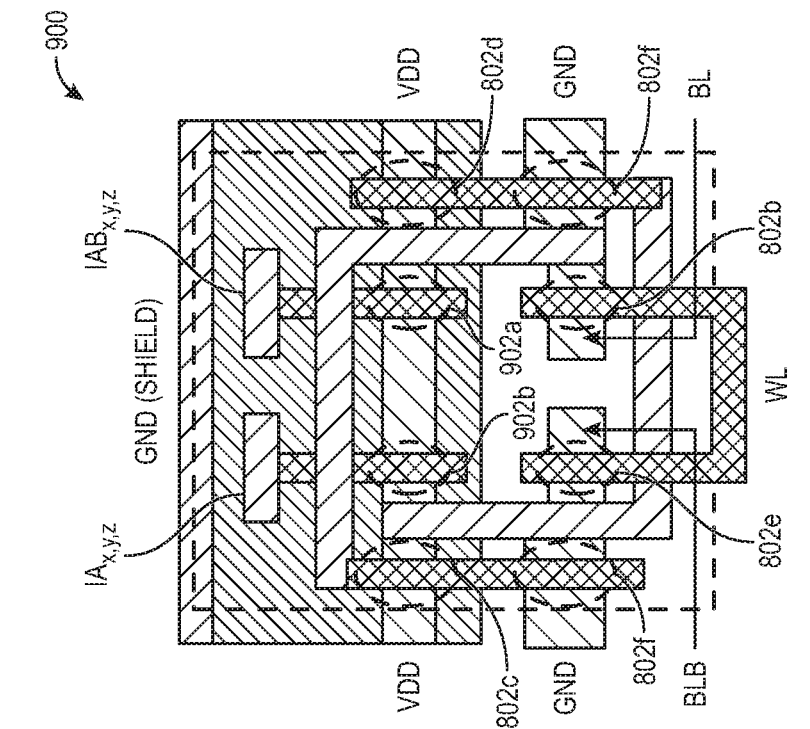
FIG. 9 shows the layout of an eight-transistor multiplying bit cell, according to some embodiments of the disclosure.

FIG. 9 shows the layout of an eight cell multiplying bit cell 900, according to some embodiments of the disclosure. The multiplying bit cell 900 includes an active transistor diffusion layer 810, an n-well layer 812, a gate-poly layer 814, and a metal layer 816. The two additional transistors in the multiplying bit cell 900 are the first transistor 902a and the second transistor 902b. The first transistor 902a corresponds to the transistor 502a in FIG. 5, and the second transistor 902b corresponds to the transistor 502b in FIG. 5.

Figure 10:
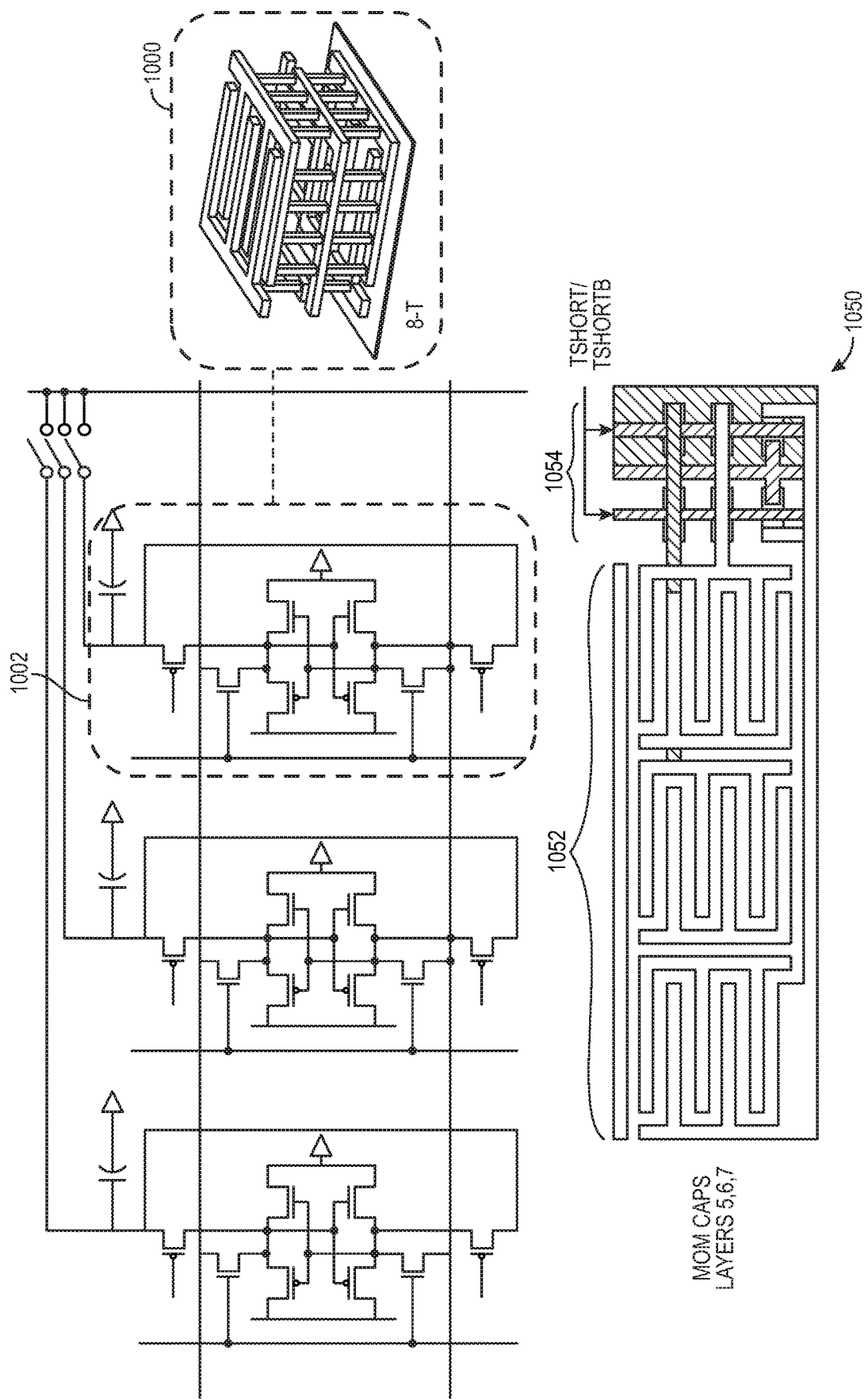
FIG. 10 shows the layout of three multiplying bit cells, according to some embodiments of the disclosure.

FIG. 10 shows the layout of three multiplying bit cells, according to some embodiments of the disclosure. In particular, the top portion of FIG. 10 shows a structure 1000 corresponding to one multiplying bit cell circuit 1002. The bottom portion of FIG. 10 shows a top view 1052 of the three multiplying bit cell circuits connected together, with the capacitor layer on the top of the circuitry, and a top view 1054 of the switches on the right side.

As shown in FIG. 10, the capacitor, which enables the high SNR compute, is implemented above the transistors using metals that are already present in a VLSI process. Thus, the capacitor does not increase the area of the multiplying bit cells on the chip, allowing for a very compact structure and reducing data movement. In some implementations, the capacitor is comprised of multiple metal layers. In one example, SRAM bits are used with pushed SRAM rules, along with a capacitor having multiple metal layers.

In some implementations, a capacitor is formed by using interconnect's metal fingers. Using interconnect's metal fingers has a low fabrication cost since no additional fabrication mask is used for fabrication. Using several stacks of interconnect metal layers can result in a very high capacitance density. In some examples, using several stacks of interconnect metal layers can result in a very high capacitance density in advanced VLSI nodes.

According to some implementations, the layout shown in FIG. 10 retains the structure for using aggressive (SRAM/push) design rules, where gate electrodes retain a highly regular pattern. In some implementations, the NMOS sizing is used to ensure read stability of the 6T cell. In other implementations, read stability is ensured by adjusting the word line (WL) voltage used for bit cell read and write operations. The filter array employs peripheral control circuitry for charge-domain multiplication/accumulation. In particular, in various implementations, peripheral control circuitry can be used for opening switches, closing switches, shorting switches, and discharging switches, as well as other operations. In some implementations, peripheral control circuitry is used for bit cell read and write operations. In particular, in some examples, peripheral control circuitry is used for word line (WL) decoders, word line (WL) drivers, bit line (BL and/or BLb) pre-chargers, and bit line (BL and/or BLb) drivers.

Figure 11:
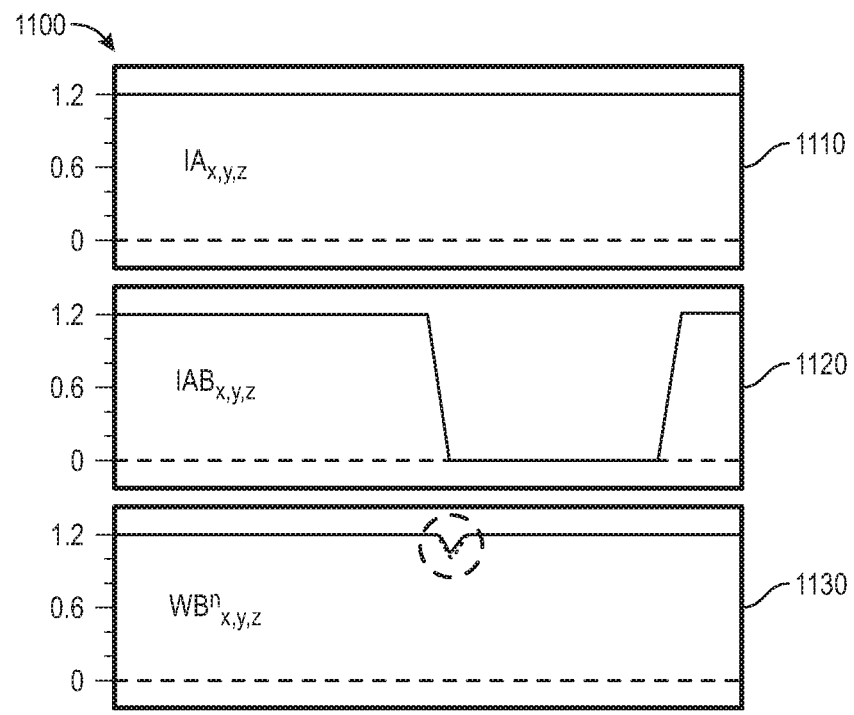
FIG. 11 is a diagram showing a transient-coupling analysis for computation within multiplying bit cells, according to some embodiments of the disclosure.

FIG. 11 is a diagram 1100 including first 1110, second 1120, and third 1130 graphs, showing a Monte Carlo (MC) simulation, considering transistor variations, showing that the pull-down condition does not disrupt data storage, according to some embodiments of the disclosure. In particular, the stored data is held high by the transistors 504a-504f in the 6T portion 520 of the bit cell 500. The first graph 1110 shows the input activation $IA_{x,y,z}$ on the first transistor 502a during the XNOR computation and charging of the capacitor 506. As shown, the input activations $IA_{x,y,z}$ is kept high, at 1.2V. The second graph 1120 shows the input activation $IAb_{x,y,z}$ on the second transistor 502b during the XNOR computation and charging of the capacitor 506. The input activation $IAb_{x,y,z}$ is brought down on the second transistor. The third graph 1130 shows the data storage weight filter $Wb''_{i,j,k}$ during the XNOR computation and charging of the capacitor 506. Note that the voltage of the stored data remains high, near 1.2V, during this operation. The transient 100k point MC simulation thus shows that the likelihood of disruption to the storage node is minimal.

One reason the pull-down condition does not disrupt data storage is that the pull down path is relatively weak since it involves a PMOS transistor for XNOR computation. Another reason the pull-down condition does not disrupt data storage is that the capacitance is relatively small, and not large enough to invoke a static pull-down condition. In various examples, the capacitance is about 1.2 fF, about 1 fF, about 1.5 fF, or between about 1 fF and about 1.5 fF.

Figure 12:
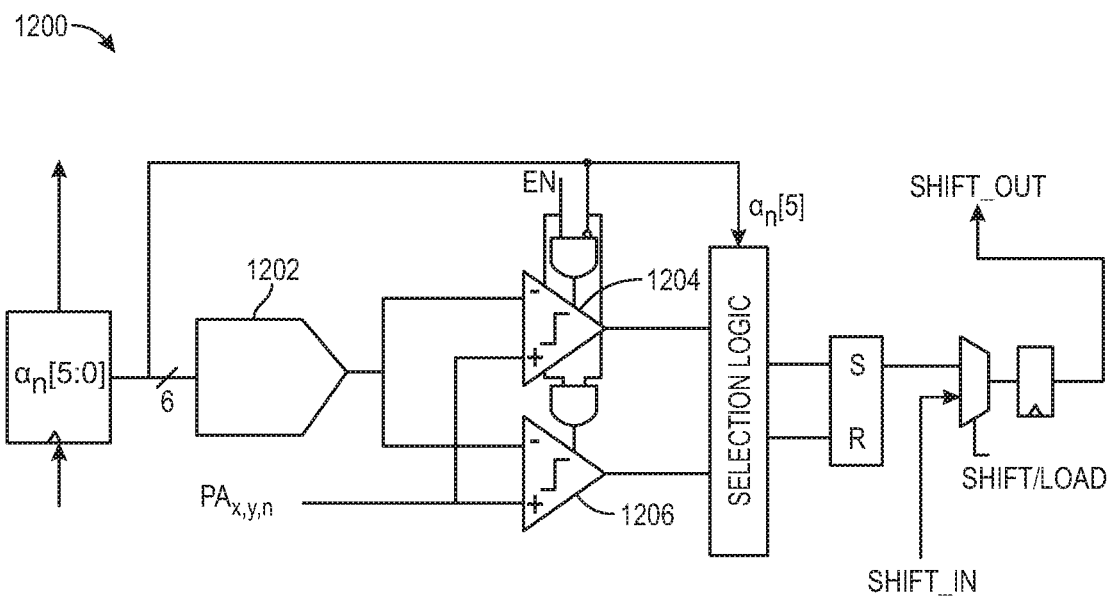
FIG. 12 is a diagram showing binarizing bin batch normalization, according to some embodiments of the disclosure.

FIG. 12 is a diagram showing a binarizing bin batch normalization block 1200, according to some embodiments of the disclosure. Referring to FIG. 3, the bin batch normalization block 312 receives the analog pre-activation values $PA_{x,y,n}$ output from the neuron array 310. To apply the non-linear activation function, the analog pre-activation values $PA_{x,y,n}$ are compared with an analog reference value, determined from training the neural network. The analog reference value is generated using a charge serial DAC 1202. In one example, a 6 bit charge sharing DAC is used to generate the analog reference voltage. In particular, the DAC 1202 converts $\alpha_n$ from a digital code to an analog reference. In various examples, the precision of the DAC is one of 4 bits, 5 bits, 6 bits, 7 bits, 8 bits, and more than 8 bits. The output from the DAC and the pre-activation $PA_{x,y,n}$ are input to a comparator. In some examples, the comparator is a clocked comparator.

In some implementations, because the analog input pre-activation values $PA_{x,y,n}$ can have any value from ground to $V_{DD}$, the bin batch normalization block 1200 includes two comparators 1204, 1206, one with NMOS input transistors and one with PMOS input transistors. Since the DAC determines the voltage level of the comparator input, according to various implementations, the most significant bit (MSB) of the DAC's digital code $\alpha_n$ is used to select the comparator 1204, 1206, which sees the highest overdrive of its input transistors. The first comparator 1204 is a PMOS input comparator, and is used for input having a value between about $V_{DD}/2$ and ground. The second comparator 1206 is a NMOS comparator, and is used for input having a value between about $V_{DD}/2$ and $V_{DD}$. The comparator 1204, 1206 enabled for each value is selected by the $\alpha_n$'s MSB bit, which is determined from neural-network training. In particular, while the analog input pre-activation can be any value depending on the computation, the analog reference is known and fixed. The analog reference can thus be used to determine if the critical inputs to compare are values between ground and $V_{DD}/2$ or between $V_{DD}/2$ and $V_{DD}$. The appropriate comparator 1204, 1206 can be selected accordingly. This ensures fast and robust regeneration, regardless of the analog input levels.

The digital output activations from the comparator decisions are loaded in a shift register. The digital output activations are provided as inputs to the next CNN stage.

In particular, after computing the pre-activation values $PA_{x,y,n}$ using the 512 parallel neuron filters in the neuron array 312, batch normalization and a binarizing activation function are applied. Equation 3 shows the operation used for batch normalization and application of an activation function $\rho$.

$$OA_{x,y,n} = \rho\left(\gamma_n \frac{PA_{x,y,n} - \mu_n}{\sigma_n^2} + \beta_n\right) \quad (3)$$

For a binarizing activation function, the scaling parameter $\gamma_n$ can be ignored since it does not change the sign, leaving only the offset causing parameters, which can be combined into the single parameter $\alpha_n$, as shown in Equation 4:

$$OA_{x,y,n} = \text{sign}(PA_{x,y,n} - \alpha_n) \quad (4)$$

Thus, applying batch normalization and the activation function reduces to sign comparison between the pre-activation $PA_{x,y,n}$ and an analog reference, derived from training.

The binarized output activation is streamed out from the binarizing bin batch normalization block 1200 using an output shift register.

Figure 13:
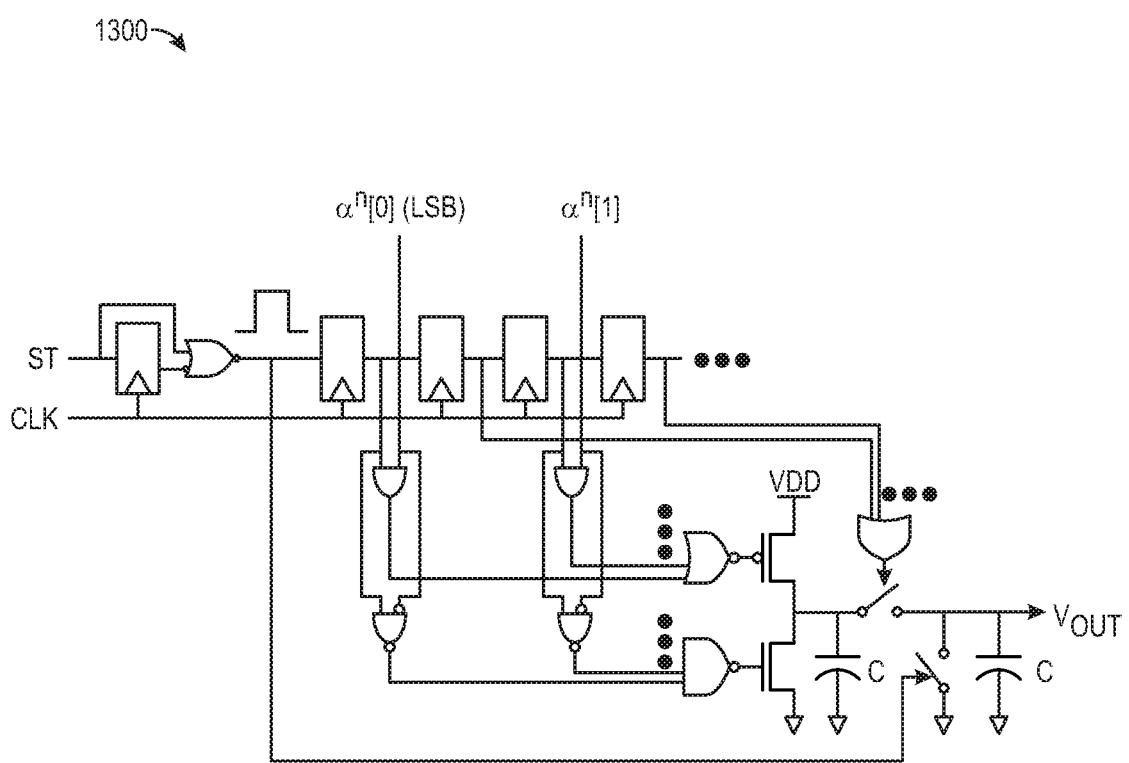
FIG. 13 is a diagram showing a digital-to-analog converter, according to some embodiments of the disclosure.

FIG. 13 is a diagram showing a digital-to-analog converter (DAC) 1300, according to some embodiments of the disclosure. The DAC 1300 is a six-bit DAC and has a serial charge redistribution structure. In the DAC 1300, the least significant bit (LSB) of the input code is applied first, to charge or discharge a transfer capacitor. The transfer capacitor transfers its charge to a similar sized accumulation capacitor. In some examples, the accumulation capacitor has the same size as the transfer capacitor. Thus, the LSB charge is attenuated with binary weighting through each charging and shorting cycle.

In some examples, the DAC is configured to convert batch-norm values to an analog signal, and compare the analog signal with the PA signals. Thus, the DAC receives the batch-norm values as input and generates an analog reference voltage for comparison.

In other implementations, the circuit includes an analog-to-digital converter (ADC), and receives the PA signals as an input signal.

Figure 14B:
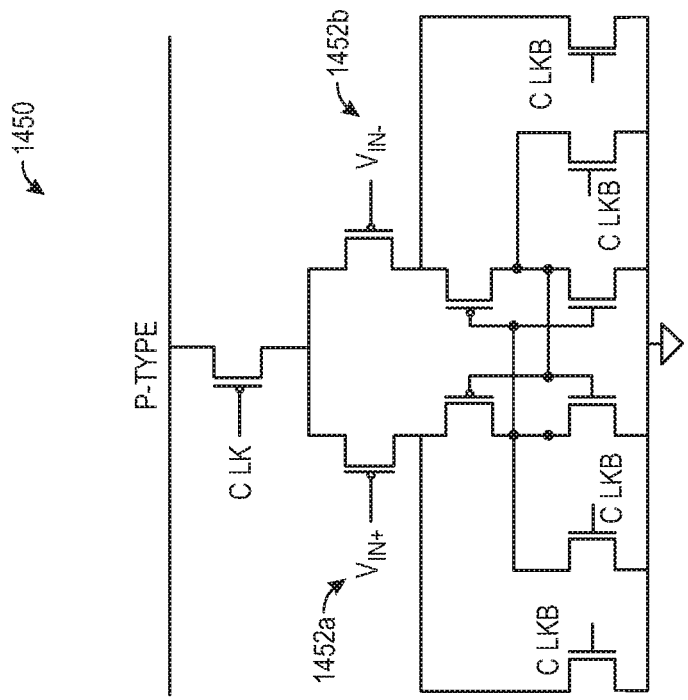
FIGS. 14A-14B are diagrams of comparators, according to some embodiments of the disclosure.
Figure 14A:
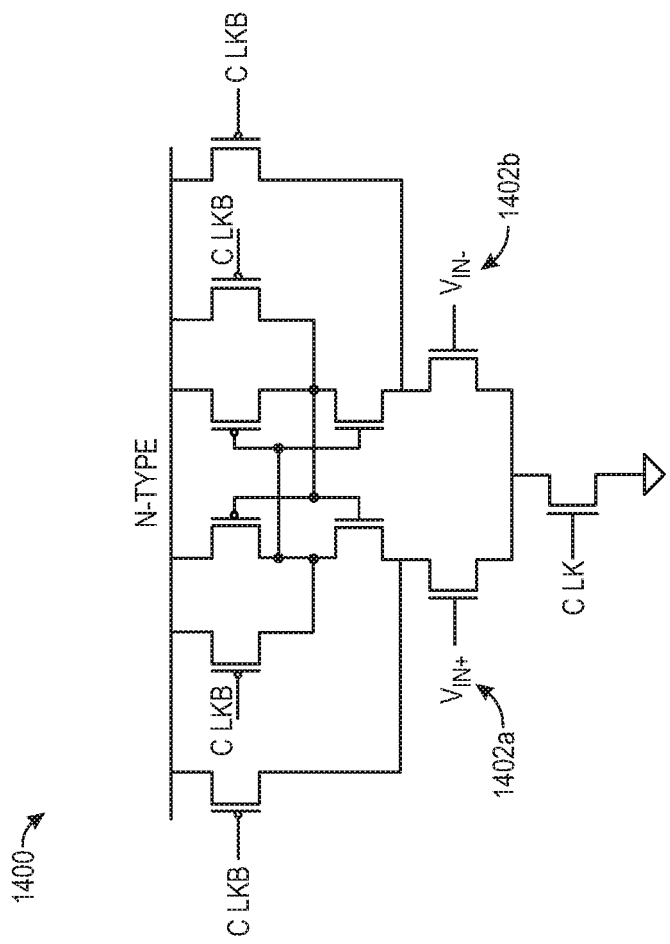

FIGS. 14A-14B are diagrams of comparators, according to some embodiments of the disclosure. FIG. 14A shows an n-type comparator 1400. FIG. 14B shows a p-type comparator 1450. The n-type comparator 1400 is an NMOS comparator, and includes first 1402a and second 1402b analog inputs. The p-type comparator 1450 is a PMOS comparator and includes first 1452a and second 1452b analog inputs.

According to one implementation, each of the comparators 1400 and 1450 has a dynamic latched structure. The dynamic latched structure does not use static current and thus achieves high power efficiency.

According to various implementations, the overall operation of the latched comparators 1400 and 1450 has two main phases. A first phase is a reset phase. In the reset phase, the drain of the input pairs is set to VDD for the n-type comparator 1400. In the reset phase, and the drain of the input pairs is set to GND for the p-type comparator 1450. The second phase is the evaluation phase. The evaluation phase is triggered by the CLK signal. In the evaluation phase, the input pair that has the higher over-drive voltage draws more current and, through positive feedback and regeneration, determines the output voltage.

Data Movement

As discussed above, CNN-accelerator energy is typically dominated by data movement of input activations, weights, and output activations. Each of these energy sources is eliminated or minimized using the systems and methods described herein. For example:

1) Input Activations: input activations are broadcast over the neuron filtering hardware. The broadcasting distance is minimized due to the high-density multiplying bit cells, which form the parallel filters.
2) Weights: weight movement is eliminated because the weights are stationary within the multiplying bit cells. Additionally, a significant number of weights can be stored on-chip in the filtering hardware, due to the high-density multiplying bit cells. In the architecture described above, 2.4 Mb of weight data can be stored on-chip.
3) Output Activations: output pre-activations are computed in a distributed manner via passive charge redistribution in the multiplying bit cell capacitors. Thus, output pre-activations are available at the output of the architecture at the cost of toggling a 1-bit switch-control signal. The output pre-activations are very high dynamic range signals. In a digital implementation, communicating output activations involves communicating a multibit signal. The multibit signal has more than 12 bits (i.e., $\log_2(3 \times 3 \times 512) > 12$). Thus, communication via the single-bit switch-control signal is significantly more energy efficient. Once available the output pre-activation is made available at the output of the architecture, the output activation is computed locally via the bin batch normalization block, which employs comparators to implement the activation function.

First Layer Circuit Design

Figure 15:
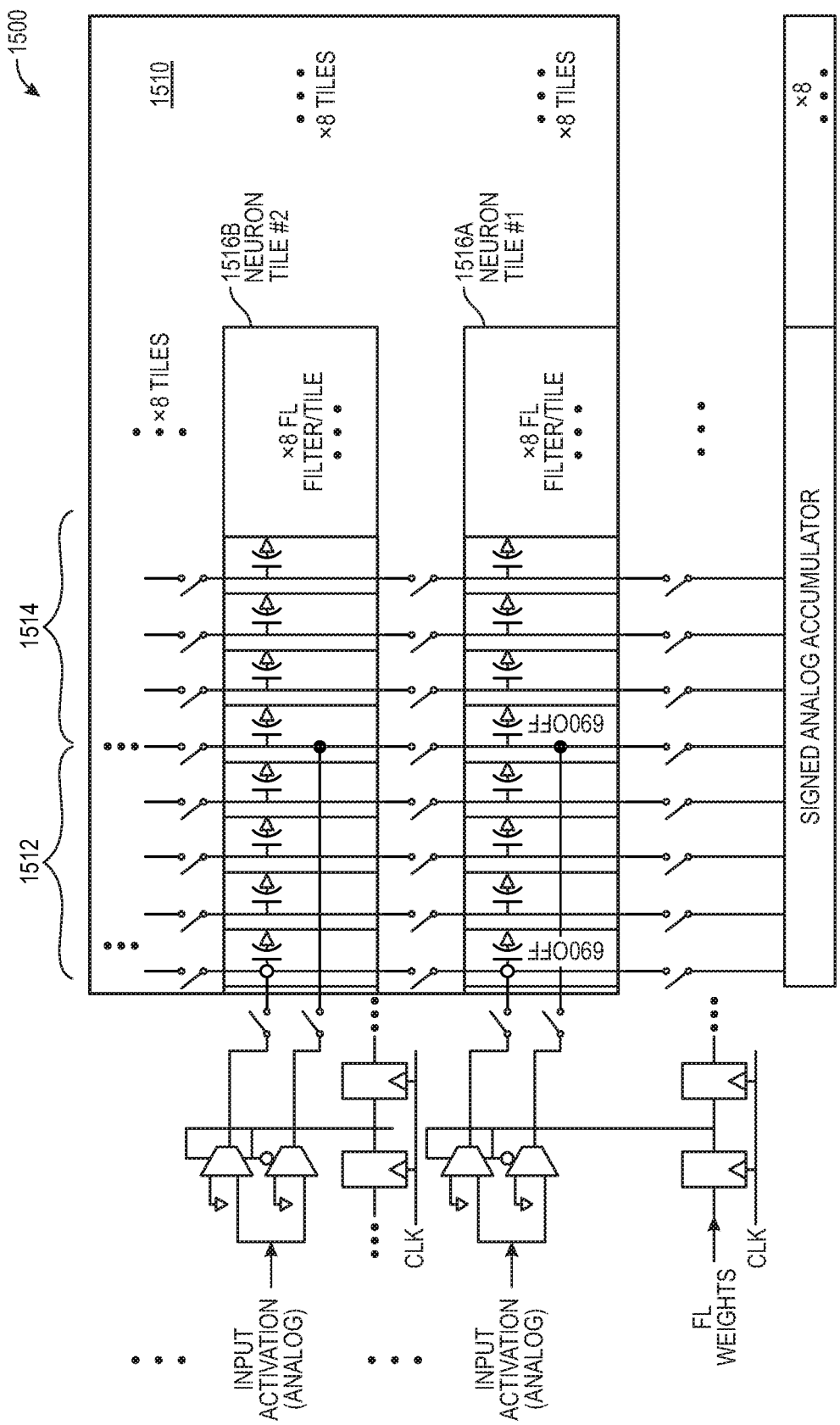
FIG. 15 is a diagram illustrating a first layer of a neural network, according to some embodiments of the disclosure.

Above, the operation of the binary-input Hidden Layers (HLs) is discussed. The same architecture can be configured to implement the analog-input First Layer (FL). FIG. 15 is a diagram illustrating a first layer 1500 of a neural network, according to some embodiments of the disclosure. The FL 1500 includes filters having large positive and negative sampling structures to maintain the fidelity of the high dynamic range input signal.

In the FL 1500, the binary input-activation signals of the multiplying bit cell are deactivated, and the tile-level shorting switches are activated. Thus, the capacitors of each filter segment within one Neuron Tile are configured as a single logical sampling capacitor. In one example, the capacitors of each filter segment within one Neuron Tile are configured as a single logical sampling capacitor of approximately 690 fF. The filter weights are binarized. Thus, filter segments are designated as positive 1512 and negative 1514 samplers. For each analog input activation, if the corresponding weight is +1, the analog input activation is sampled on its positive sampler while holding the alternate sampler at ground. Similarly, for each analog input activation, if the corresponding weight is −1, the analog input activation is sampled on its negative sampler while holding the alternate sampler at ground.

According to some implementations, the input-layer filters have a size of 3×3×3. Thus, there are 27 analog inputs, and 27 positive samplers and 27 negative samplers are used to implement each FL filter. In the architecture's 8×8 array of Neuron Tiles 1516a, 1516b, there are eight filter segments per column. Thus, for each FL filter, four columns are designated for the positive sampler and four columns are designated for the negative sampler. Filtering then simply includes adding the charge from the positive samplers of each filter and subtracting the charge from negative samplers of each filter.

Figure 16A:
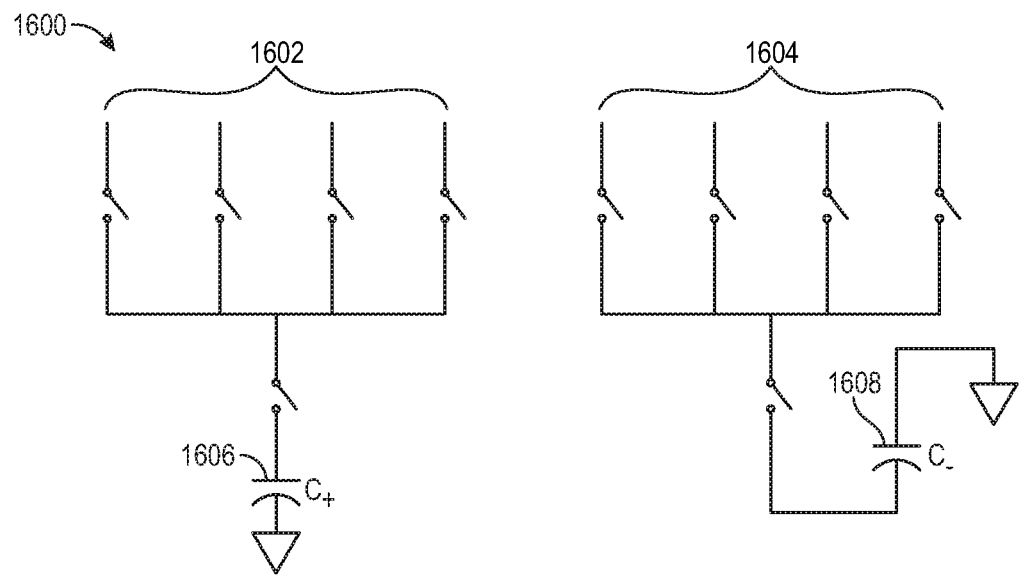
FIG. 16A-16B are diagrams illustrating a signed analog accumulator, according to some embodiments of the disclosure.
Figure 16B:
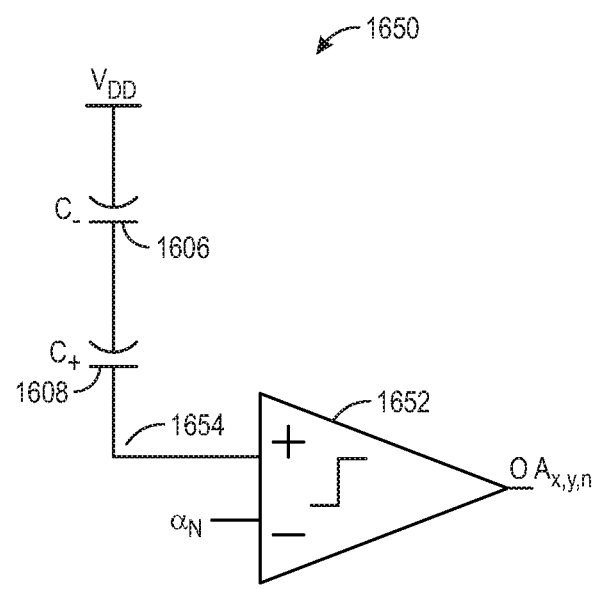

FIG. 16A-16B are diagrams illustrating a analog signal accumulator for performing charge addition and subtraction, according to some embodiments of the disclosure. In particular, FIG. 16A shows a sample phase 1600 for a signed analog accumulator. FIG. 16B shows a compare phase 1650 for a signal analog accumulator. In FIG. 16A, the charge from four columns of positive samplers 1602 are shared to the top plate of a first capacitor 1606. Similarly, the charge from four columns of negative samplers is shared to the bottom plate of a second capacitor 1608. According to various implementations, the first 1606 and second 1608 capacitors are equal valued capacitors.

Signed summation of the charge on the first 1606 and second 1608 capacitors is achieved by using switches to configure the first 1606 and second 1608 capacitors into the configuration shown in FIG. 16B. For the compare phase 1650, the positive charge from the first capacitor 1606 is added and the negative charge from the second capacitor 1608 is subtracted, and the total is input to the comparator 1652. Additionally, the output voltage is offset such that zero is at mid-scale. The other input to the comparator 1652 is the $\alpha_n$ analog reference value from training. These values are compared as described above with reference to the Bin Batch Norm block and FIG. 12.

Figure 17:
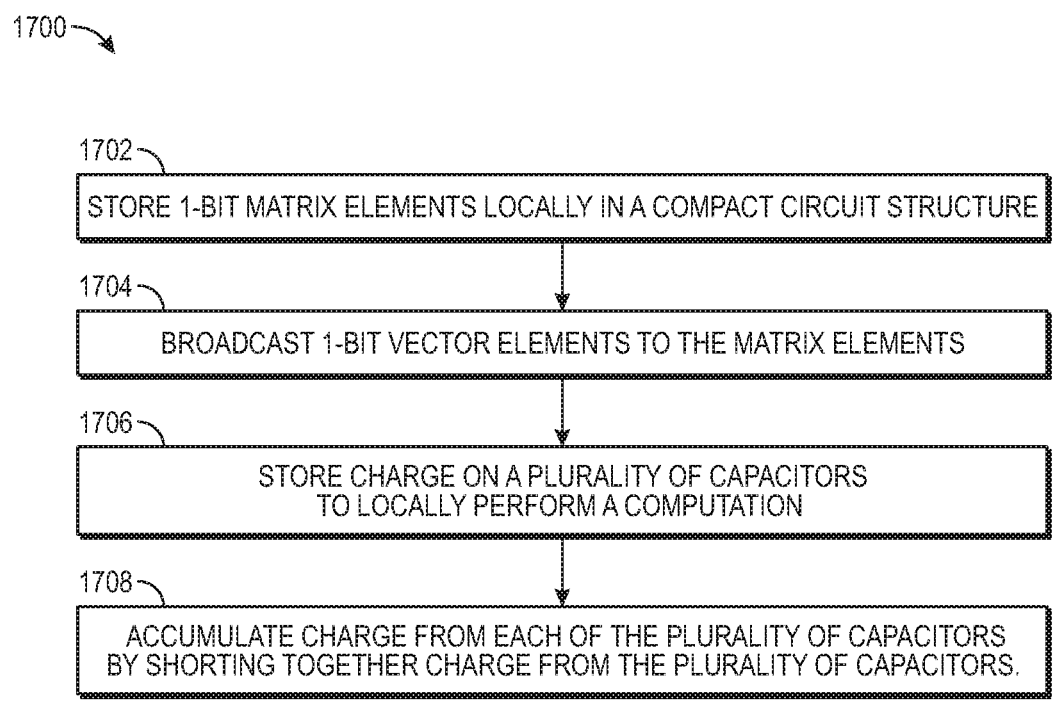
FIG. 17 is a diagram of a method for matrix-vector computations, according to some embodiments of the disclosure.

FIG. 17 is a diagram 1700 of a method for matrix-vector computations, according to some embodiments of the disclosure. The method includes, at step 1702, storing 1-bit matrix elements locally in a compact circuit structure. In some examples, the compact circuit structure includes multiple transistors, and an input signal is received at the transistors. At step 1704, 1-bit vector elements are broadcast to the matrix elements. At step 1706, charge is stored on a set of capacitors to locally perform a computation. At step 1708, charge is accumulated from each of the capacitors by shorting together charge from the capacitors. In some examples, accumulating charge from each of the capacitors results in generating an analog pre-activation value.

In some implementations, the method includes performing analog charge domain computations using the 1-bit matrix elements and the 1-bit vector elements.

In some implementations, before charge is stored on the capacitors, the capacitors are discharged, and discharging the capacitors results in the charge on each of the capacitors having a logic value of zero. Then, each of the capacitors is conditionally charged based on a respective matrix element and a respective vector element. Discharging the capacitors includes closing a set of switches, wherein each switch is coupled to a corresponding capacitor, and activating a discharge transistor. For accumulation of the charge from the capacitors, the set of switches are closed to cause the charge from each of the capacitors to short together.

Charge sharing among capacitors using only electronic switches and capacitor elements allows signals processing to be performed in the analog domain. A sampled analog filter filters incoming analog signals without first digitizing the signals, this eliminates any data path quantization noise issues and analog-to-digital and digital-to-analog conversion steps.

In some implementations, the systems and methods for reducing power consumption in neural networks are implemented on a CNN-engine integrated with an active-matrix analog-output imager. In one example, a CNN-engine integrated with an active-matrix analog-output imager enhances clarity as compared to a CNN-engine without an imager. The architecture and circuits described are more general than the specific implementation described herein.

According to one implementation, the input pixels from an imager are accessed from a column-×-row (C×R) active-matrix imager, one row at a time, and pixel data corresponds to red/green/blue (R/G/B). The neurons, referred to as filters herein, operate on an N×N patch of pixels for each of the three colors (R/G/B). Thus, for the input layer, filters have a size of N×N×3. The architecture supports D filters, operating in parallel on the input activations. Thus, internal layers after the input layer have filters of size N×N×D. In one example, N=3 and D=512.

The CNN hardware can be trained in the same manner as a CNN accelerator is trained. In one implementation, the CNN hardware is trained using mathematical models for backward/forward propagation in stochastic gradient decent. In other implementations, the CNN hardware is trained using mathematical models for backward/forward propagation in a variation of stochastic gradient decent. In some examples, the mixed-signal hardware is used for forward propagation, rather than mathematical models. Using the mixed-signal hardware for forward propagation causes non-idealities of the hardware to be compensated by the model-training process. According to some example, when using mathematical models, non-idealities of the hardware can result in output errors.

Variations and Implementations

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In some implementations, memory can be implemented any type of memory. For example, DRAM, MRAM, NRAM, RRAM memory can be used instead of SRAM. SRAM is static random access memory. DRAM is dynamic random access memory, MRAM is magnetoresistive random access memory. NRAM is nano random access memory. RRAM is resistive random access memory. Other types of random access memory can be used. In some examples, other types of memory can be used.

In other example embodiments, the system and methods discussed herein can be used in any type of neural network. For example, bitwise neural networks, recurrent neural networks, fully recurrent networks, Hopfield networks, Boltzmann machines, and stochastic neural networks. In some examples, non-linear activations are used.

Neurons can be any selected size, and neuron patches and neuron tiles can also be any size. The stride can be any value.

In some implementations, the systems and methods discussed herein are used for multibit analog matrix multiplication, by using binary weighted capacitors realized in the bit cells.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the clocking and filtering functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, particularly those that use sampled analog, some of which may be associated with processing real-time data. Certain embodiments can relate to multi-DSP signal processing, floating point processing, signal/control processing, fixed-function processing, microcontroller applications, etc.

In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to clocking in sampled analog systems, illustrate only some of the possible clocking functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES, EXAMPLES, AND IMPLEMENTATIONS

Note that all optional features of the apparatus described above may also be implemented with respect to the method or process described herein and specifics in the examples may be used anywhere in one or more embodiments.

In a first example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The system can include means for clocking data from the digital core onto a first data output of a macro using a first clock, the first clock being a macro clock; means for clocking the data from the first data output of the macro into the physical interface using a second clock, the second clock being a physical interface clock; means for clocking a first reset signal from the digital core onto a reset output of the macro using the macro clock, the first reset signal output used as a second reset signal; means for sampling the second reset signal using a third clock, which provides a clock rate greater than the rate of the second clock, to generate a sampled reset signal; and means for resetting the second clock to a predetermined state in the physical interface in response to a transition of the sampled reset signal.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:

1. An apparatus for in-memory computing using charge-domain circuit operation, comprising:
    a first plurality of transistors configured as memory bit cells;
    a second plurality of transistors configured to perform in-memory computing using the memory bit cells;
    a plurality of capacitors, each capacitor of the plurality of capacitors corresponding to a respective memory bit cell, wherein each capacitor is configured to use a result of in-memory computing from the respective memory bit cell; and
    a plurality of switches, wherein, based on a setting of each of the plurality of switches, the charges on at least a portion of the plurality of capacitors are shorted together;
    wherein shorting together the plurality of capacitors yields a computation result.

2. The apparatus of claim 1, wherein the first plurality of transistors is configured to store a plurality of matrix values.

3. The apparatus of claim 2, wherein the second plurality of transistors is configured to receive an input signal, perform analog charge-domain computations using the input signal and the plurality of matrix values, and generate the result of in-memory computing.

4. The apparatus of claim 1, wherein the plurality of capacitors are positioned above the first plurality of transistors and the second plurality of transistors.

5. The apparatus of claim 1, wherein the plurality of capacitors are formed from a dielectric between interconnect layers in a VLSI technology.

6. The apparatus of claim 1, wherein the apparatus is configured to be placed in a neural network.

7. The apparatus of claim 1, wherein the first plurality of transistors are configured as one of single memory bit cells and multiple memory bit cells.

8. A circuit for matrix-vector computations, comprising:
    a plurality of bit cell portions configured to store matrix elements, receive broadcast vector elements, perform compute operations, and generate bit cell outputs;
    a plurality of capacitors, each capacitor of the plurality of capacitors corresponding to a respective bit cell portion of the plurality of bit cell portions and configured to use a respective bit cell output from the respective bit cell portion; and
    a plurality of switches, wherein, in a first switch configuration, charge from at least a portion of the plurality of capacitors are shorted together.

9. The circuit of claim 8, wherein the circuit is configured to perform matrix-vector multiplication operations.

10. The circuit of claim 8, wherein the compute operations include logic operations.

11. The circuit of claim 8, wherein the plurality of capacitors are positioned above the plurality of bit cell portions.

12. The circuit of claim 8, wherein the plurality of bit cell portions are configured as one of single memory bit cells and multiple memory bit cells.

13. The circuit of claim 8, wherein the plurality of bit cell portions each include a plurality of transistors.

14. A method for matrix-vector computation, comprising:
storing 1-bit matrix elements locally in a compact circuit structure;
broadcasting 1-bit vector elements to the matrix elements;
storing charge on a plurality of capacitors to locally perform a computation, wherein each of the plurality of capacitors corresponds to a respective 1-bit matrix element; and
accumulating charge from each of the plurality of capacitors by shorting together charge from the plurality of capacitors.

15. The method of claim 14, further comprising performing analog charge domain computations using the 1-bit matrix elements and the 1-bit vector elements.

16. The method of claim 14, wherein the compact circuit structure includes a plurality of transistors, and further comprising receiving an input signal at the plurality of transistors.

17. The method of claim 14, further comprising:
discharging the plurality of capacitors, wherein discharging results in the charge on each of the plurality of capacitors having a logic value of zero; and
conditionally charging each of the plurality of capacitors, based on a respective matrix element and a respective vector element.

18. The method of claim 17, wherein discharging the plurality of capacitors further comprises:
closing a first plurality of switches, wherein each switch of the plurality of switches is coupled to a corresponding capacitor of the plurality of capacitors, and activating a discharge transistor.

19. The method of claim 14, wherein accumulating charge from each of the plurality of capacitors results in generating an analog pre-activation value.

20. The method of claim 14, further comprising closing a plurality of first switches to cause the charge from each of plurality of capacitors to short together, wherein each of the plurality of first switches is connected to a respective capacitor from the plurality of capacitors.

* * * * *